(12) United States Patent
Kim et al.

(10) Patent No.: US 9,184,169 B2
(45) Date of Patent: Nov. 10, 2015

(54) METHODS OF FORMING FINFET DEVICES IN DIFFERENT REGIONS OF AN INTEGRATED CIRCUIT PRODUCT

(71) Applicant: GLOBALFOUNDIES Inc., Grand Cayman (KY)

(72) Inventors: Ryan Ryoung-Han Kim, Albany, NY (US); Youngtag Woo, San Ramon, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 61 days.

(21) Appl. No.: 14/250,064

(22) Filed: Apr. 10, 2014

(65) Prior Publication Data

US 2015/0294976 A1    Oct. 15, 2015

(51) Int. Cl.
| | |
|---|---|
| *H01L 21/336* | (2006.01) |
| *H01L 27/11* | (2006.01) |
| *H01L 21/8234* | (2006.01) |
| *H01L 21/306* | (2006.01) |
| *H01L 21/308* | (2006.01) |
| *H01L 29/66* | (2006.01) |

(52) U.S. Cl.
CPC .......... *H01L 27/1104* (2013.01); *H01L 21/308* (2013.01); *H01L 21/30604* (2013.01); *H01L 21/823431* (2013.01); *H01L 27/1116* (2013.01); *H01L 29/6656* (2013.01)

(58) Field of Classification Search
CPC ................. H01L 21/823431; H01L 21/823475
USPC .......................................................... 438/284
See application file for complete search history.

(56) References Cited

U.S. PATENT DOCUMENTS

| | | | | |
|---|---|---|---|---|
| 6,483,156 | B1 * | 11/2002 | Adkisson et al. | 257/401 |
| 8,389,383 | B1 * | 3/2013 | Hopkins | 438/462 |
| 8,921,915 | B2 * | 12/2014 | Park | 257/315 |

* cited by examiner

*Primary Examiner* — Chandra Chaudhari
(74) *Attorney, Agent, or Firm* — Amerson Law Firm, PLLC

(57) ABSTRACT

In one example, the method includes performing at least one process operation to form a first plurality of active fins and at least one sacrificial fin in a first area of a substrate while forming only a second plurality of active fins in a second area of said substrate, forming a fin removal masking layer that covers all of the active fins in both said first and second areas and exposes said at least one sacrificial fin in the first area, with the fin removal masking layer in position, performing at least one etching process to remove the at least one sacrificial fin in the first area and removing the fin removal masking layer.

24 Claims, 23 Drawing Sheets

(Standard Logic Cell)

(Dense SRAM w/ Fin Cut)

(SRAM w/ Fin Cut)

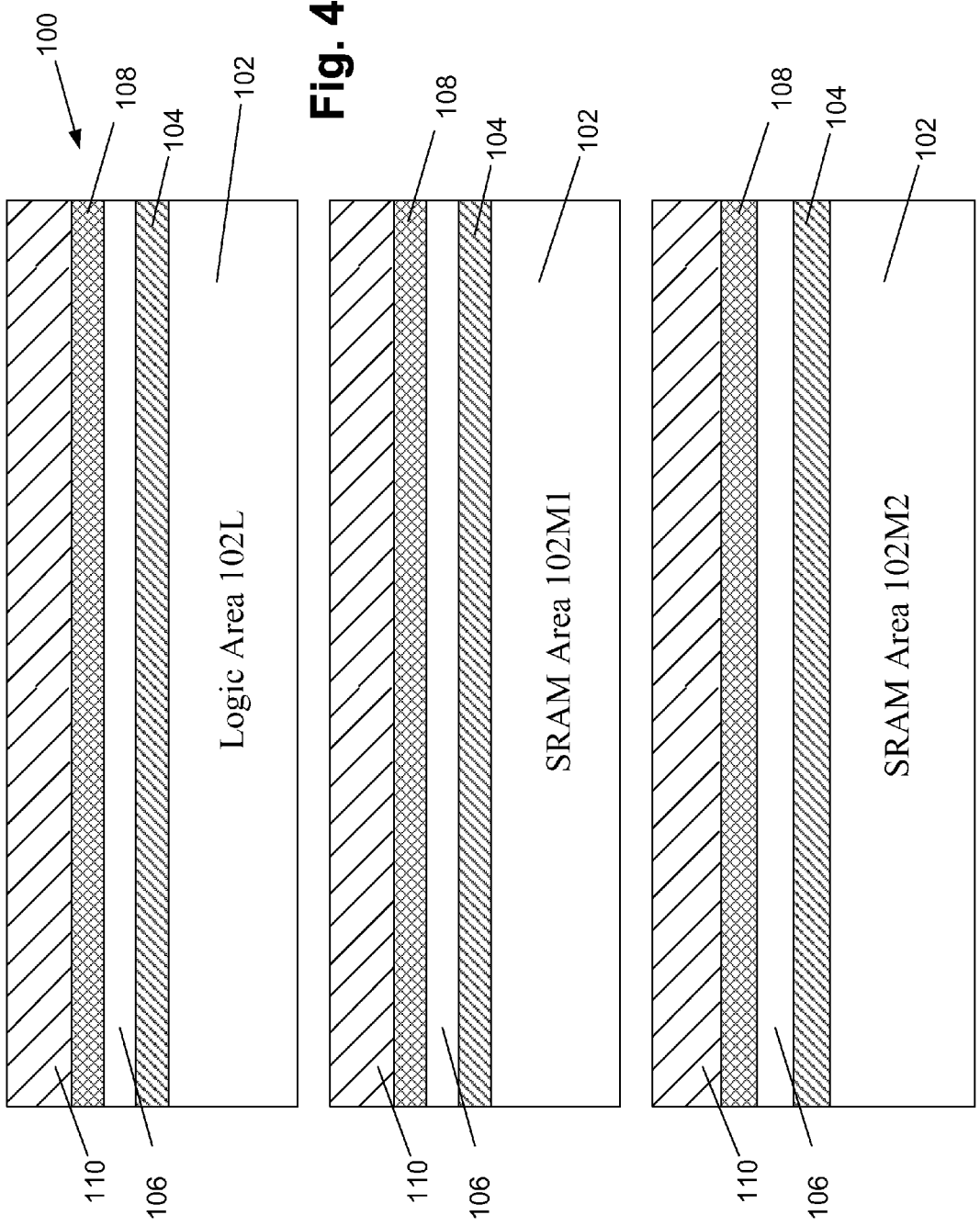

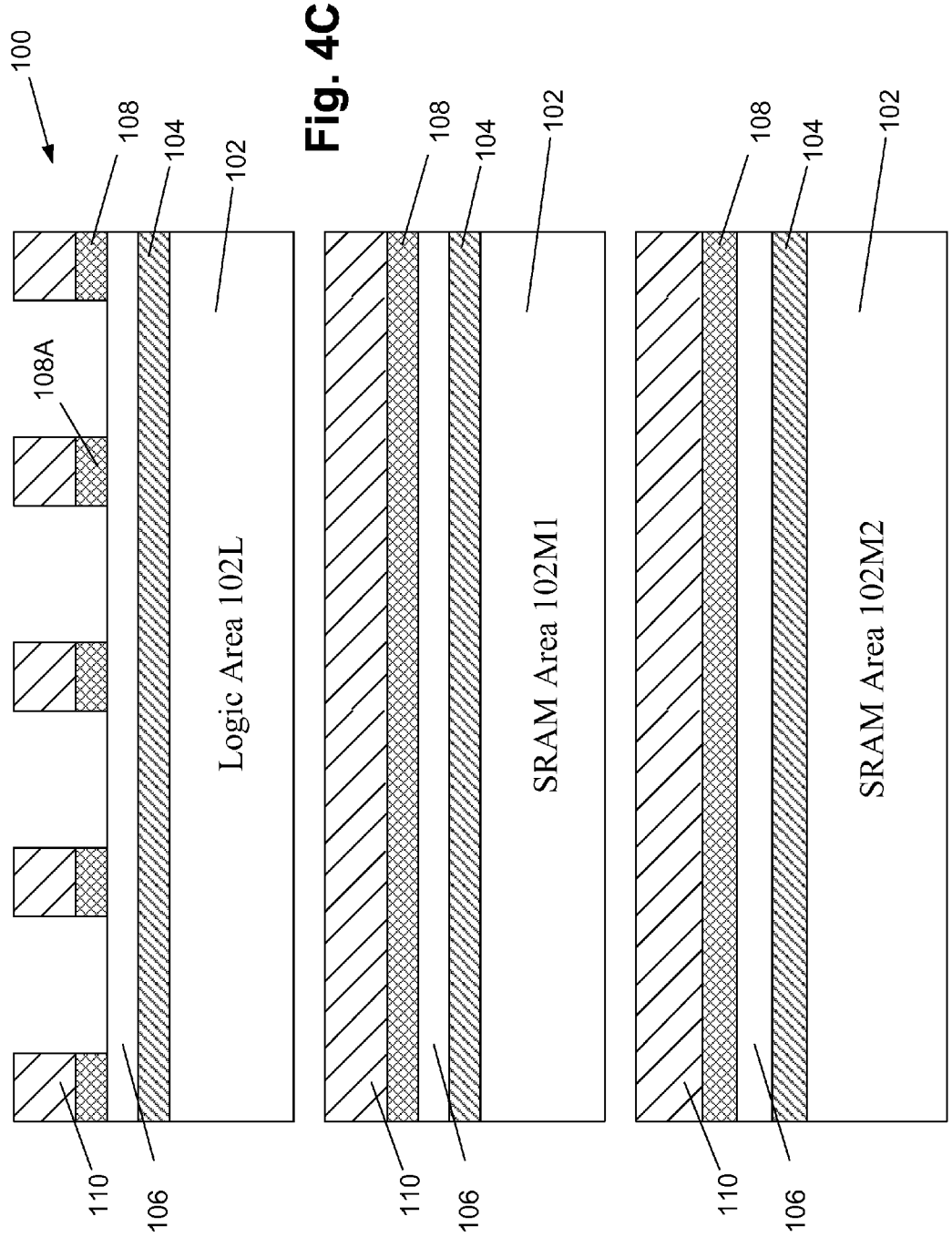

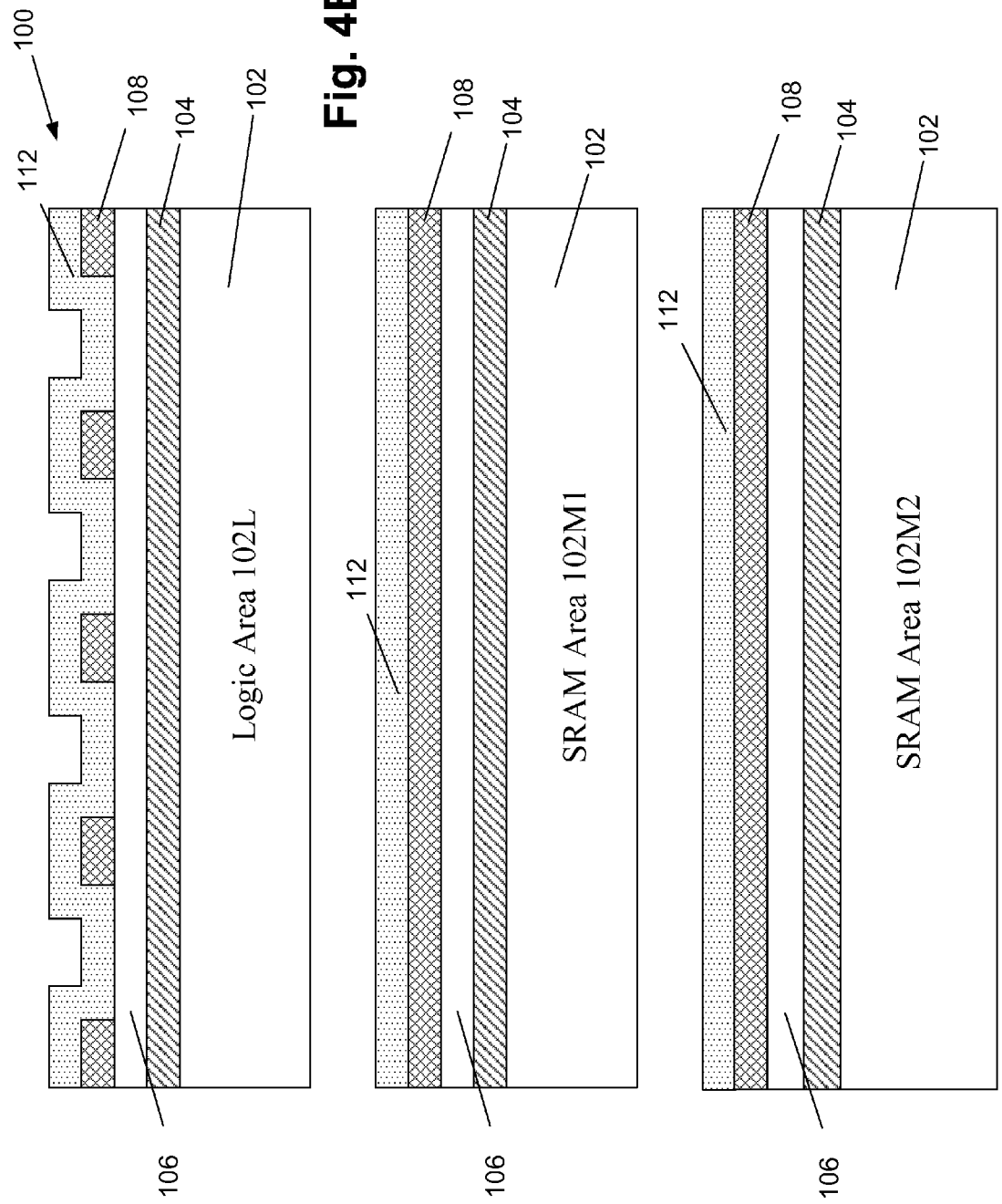

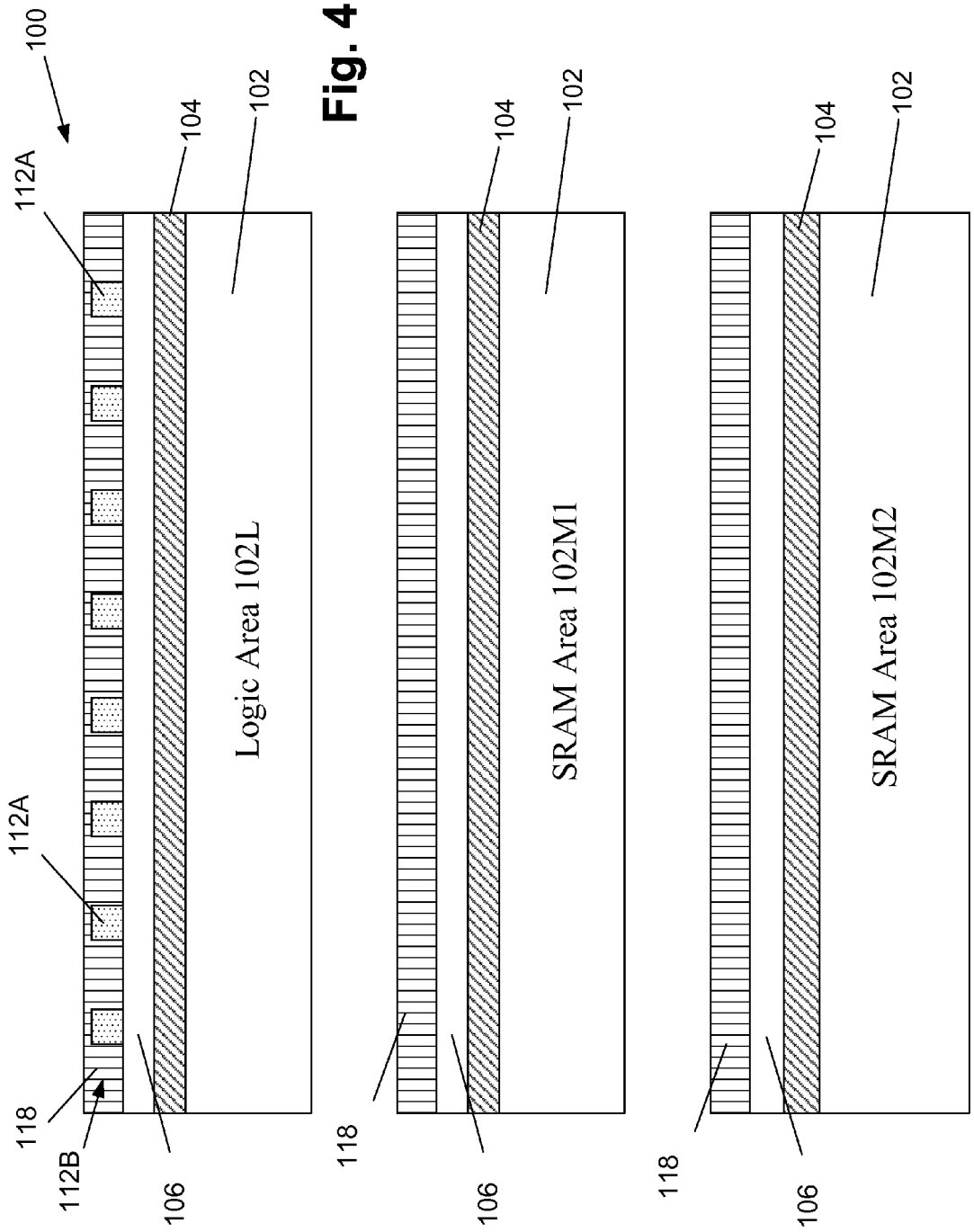

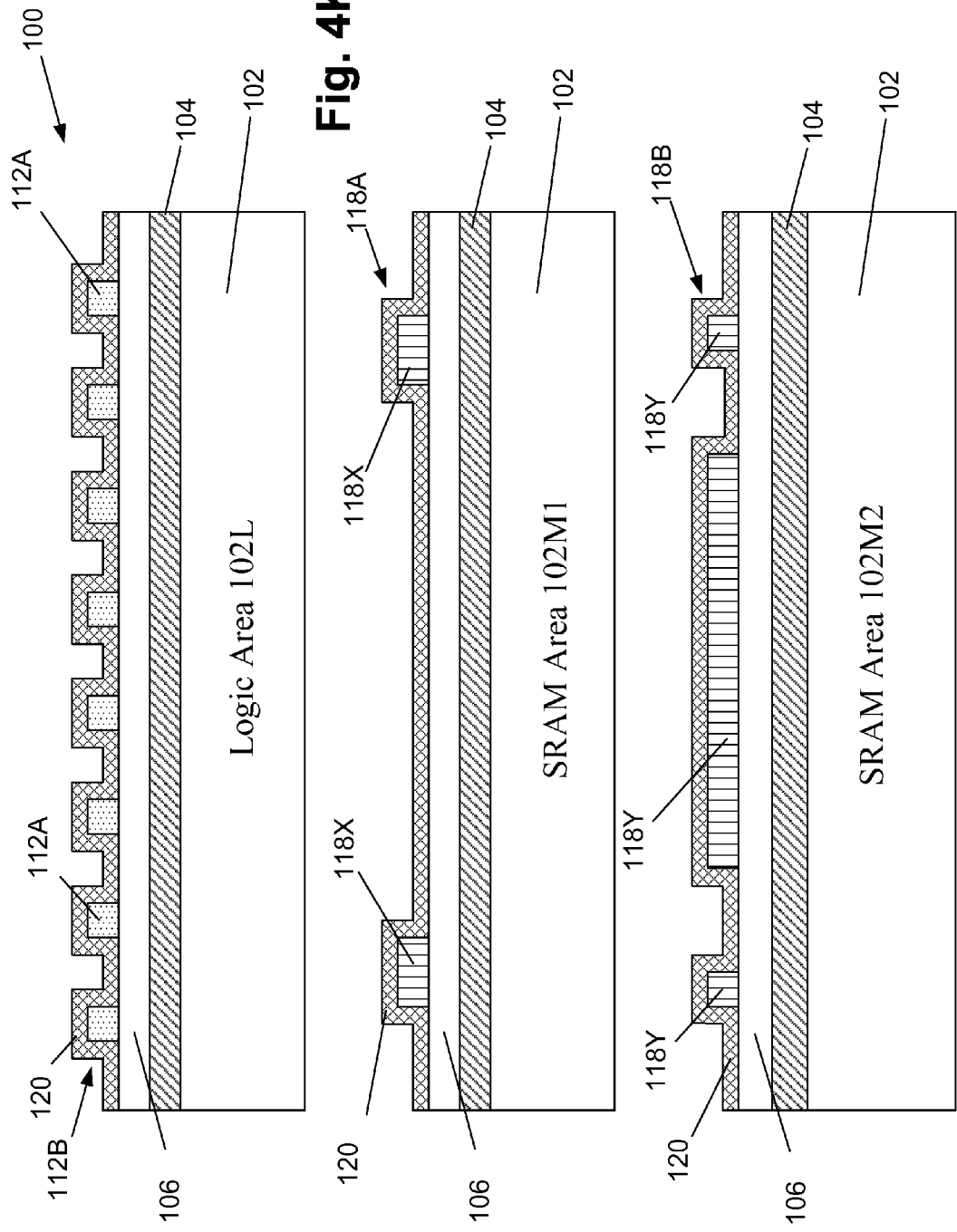

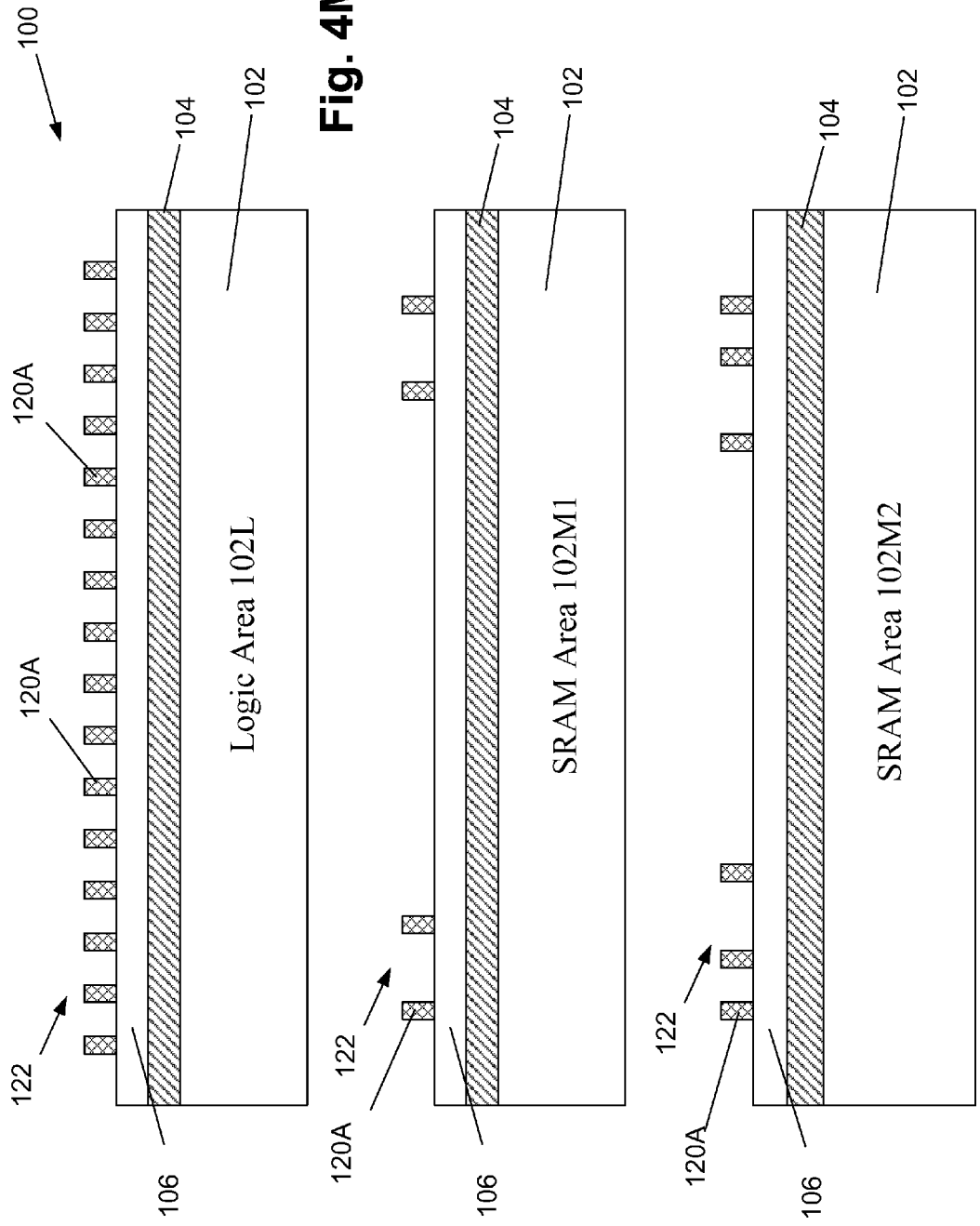

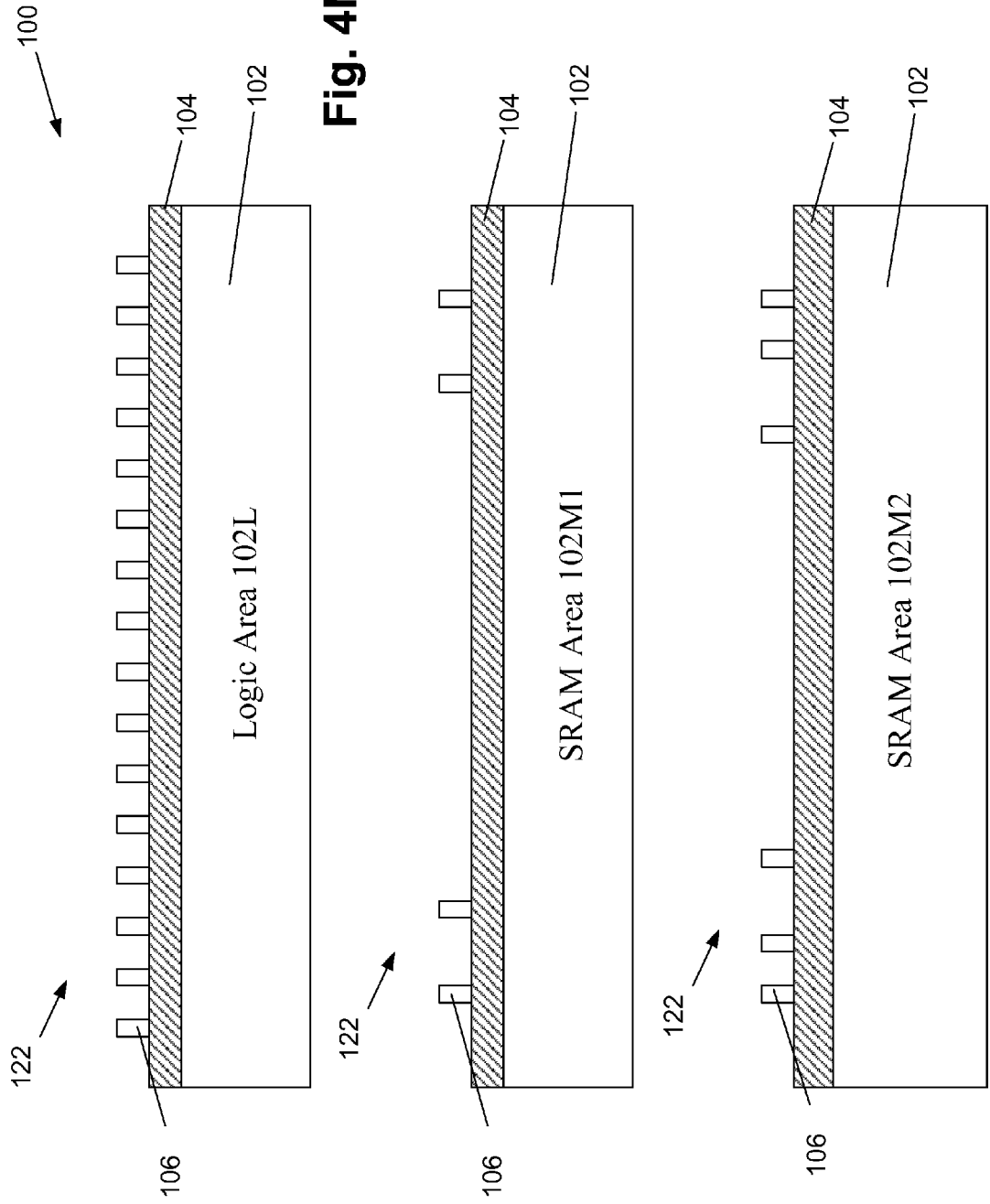

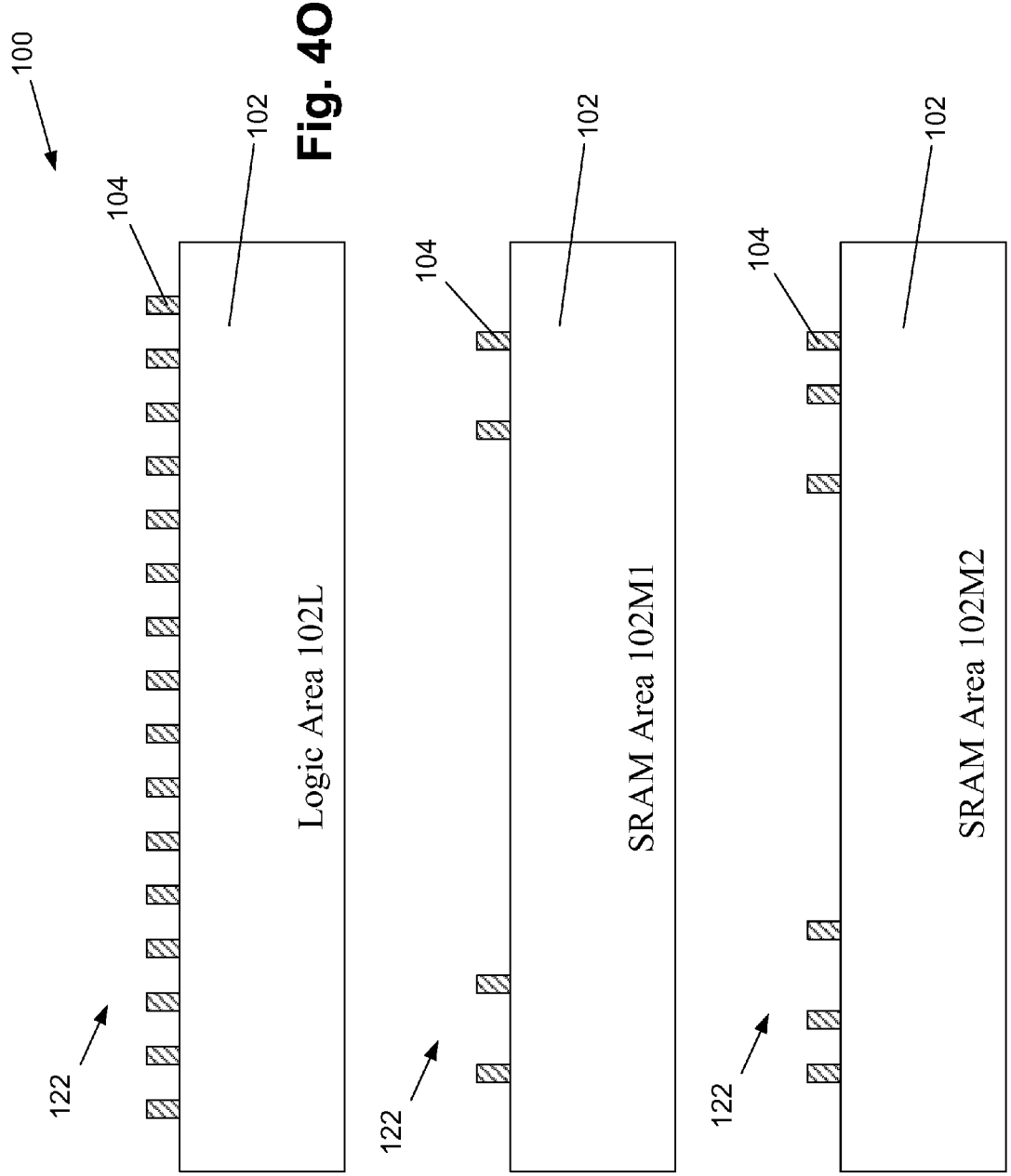

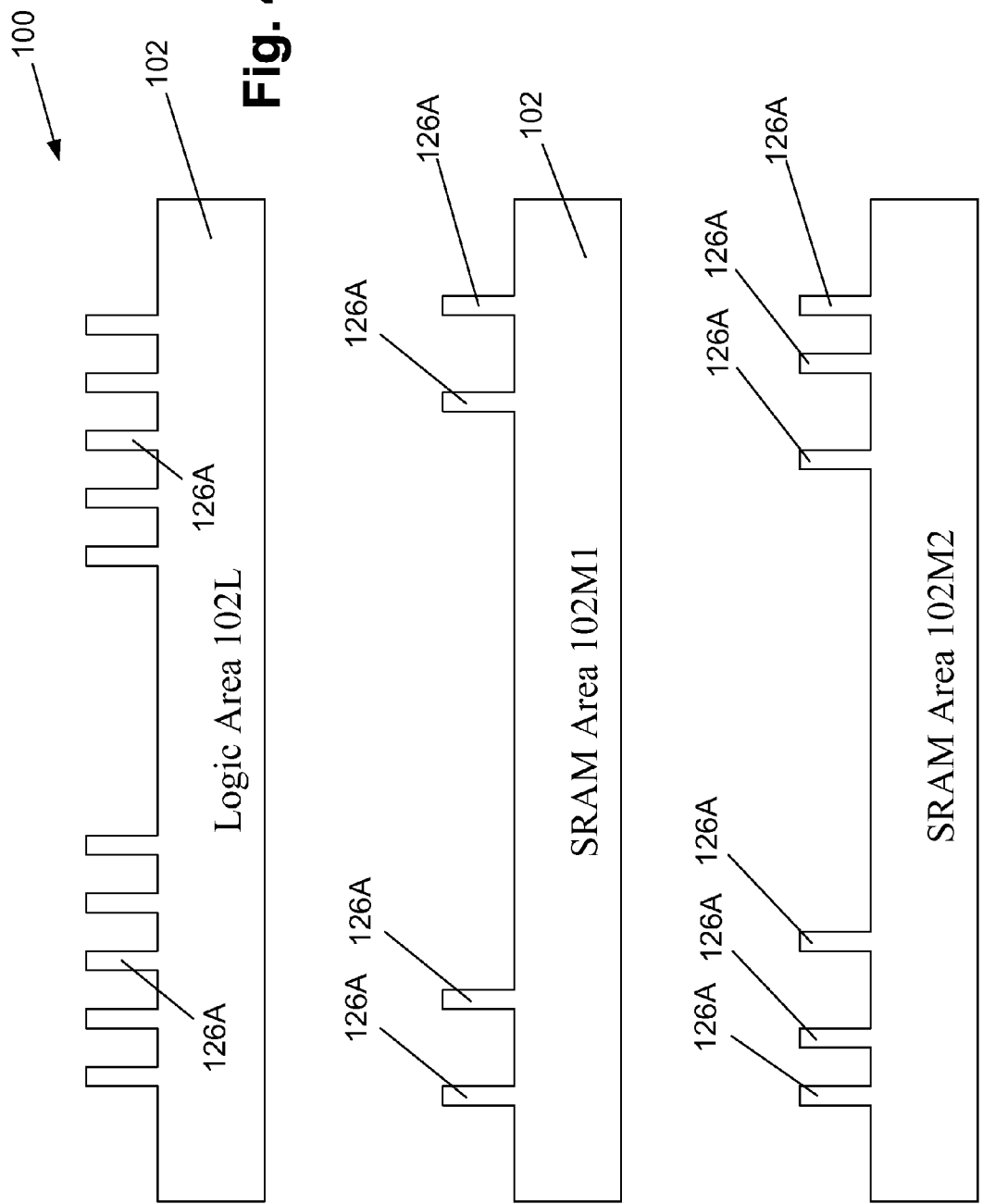

METHODS OF FORMING FINFET DEVICES IN DIFFERENT REGIONS OF AN INTEGRATED CIRCUIT PRODUCT

BACKGROUND OF THE INVENTION

1. Field of the Invention

The present disclosure generally relates to the manufacture of semiconductor devices, and, more specifically, to various methods of forming FinFET devices in different regions of an integrated circuit product, such as the memory and logic regions of an integrated circuit product.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1 is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. Trenches T are formed in the substrate B to define the fins C. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. The 3D structure of a FinFET device is a superior MOSFET structure as compared to that of a planar FET, especially in the sub-20 nm CMOS technology node and beyond.

Both FET and FinFET semiconductor devices have an isolation structure, e.g., a shallow trench isolation structure, that is formed in the semiconducting substrate around the device so as to electrically isolate the semiconductor device. Traditionally, isolation structures were always the first structure that was formed when manufacturing semiconductor devices. The isolation structures were formed by etching the trenches for the isolation structures and thereafter filling the trenches with the desired insulating material, e.g., silicon dioxide. After the isolation structures were formed, various process operations were performed to manufacture the semiconductor device. In the case of a FinFET device, this involved masking the previously formed isolation structure and etching the trenches in the substrate that defined the fins. As FinFET devices have been scaled to meet ever increasing performance and size requirements, the width W of the fins C has become very small, e.g., 6-12 nm, and the fin pitch has also been significantly decreased, e.g., the fin pitch may be on the order of about 30-60 nm.

However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially form the trenches T in the substrate B to define multiple "fins" that extend across the substrate, and thereafter remove some of the fins C where larger isolation structures will be formed. Some of the fins (or portions thereof) will be "active fins," i.e., fins that are part of a functional FinFET device, while some of the fins (or portions thereof) are sacrificial or "dummy fins" that will be removed after all of the fins are initially formed. The fins will also be cut—an end cut process—to their desired final axial length. Using this type of manufacturing approach, better accuracy and repeatability may be achieved in forming the fins C to very small dimensions due to the more uniform environment in which the etching process that forms the trenches T is performed. As noted above, after the trenches T have been formed, some of the fins C must be removed to remove sacrificial fins and/or to create room for or define the spaces where isolation regions will ultimately be formed. There are two commonly employed techniques for accomplishing the goal of removing the desired number of fins C: (1) "Fins-cut-First" and (2) "Fins-cut-Last," etc.

Semiconductor memory devices are in widespread use in many modern integrated circuit devices and in many consumer products. In general, memory devices are the means by which electrical information is stored. There are many types of memory devices, SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Special read/write circuitry is used to access the memory device to store digital information on such a memory device and to determine whether or not a charge is presently stored in the memory device. These program/erase cycles ("P/E cycles") typically occur millions of times for a single memory device over its effective lifetime.

In general, efforts have been made to reduce the physical size of such memory devices, particularly reducing the physical size of components of the memory devices, such as transistors, to increase the density of memory devices, thereby increasing performance and decreasing the costs of the integrated circuits incorporating such memory devices. Increases in the density of the memory devices may be accomplished by forming smaller structures within the memory device and by reducing the separation between the memory devices and/or between the structures that make up the memory device. Often, these smaller design rules are accompanied by layout, design and architectural modifications which are either made possible by the reduced sizes of the memory device or its components, or such modifications are necessary to maintain performance when such smaller design rules are implemented.

Many different types of devices, having different configurations, are typically formed on the same integrated circuit product. For example, memory devices, such as SRAMs, and logic devices, such as microprocessors, are typically part of the same integrated circuit product. As is common, the substrate is segregated into different areas or regions where these different devices are formed. As an example, the substrate may be segregated into one or more logic areas, where logic devices are formed, and one or more memory areas, where memory devices are formed. Unfortunately, when the memory devices and logic devices are made using FinFET devices, the fin removal process discussed above may be more problematic due to the more complicated arrangement of the active and dummy fins in memory devices, such as SRAM devices, as compared to the arrangement of active and dummy fins in logic devices. For example, in SRAM devices, a single dummy fin that is positioned next to a single active fin must be removed without damaging the single active fin. Such a situation is typically not present in many logic devices. Similar problems may arise when forming two different types of logic devices, e.g., standard logic devices and non-standard (analog) logic devices.

FIG. 2 is a simplistic depiction of an illustrative logic area 20 of an integrated circuit product that includes a plurality of fins, generally designated with the reference number 22, that are formed in a substrate. The fins 22 are initially formed as a so-called "sea-of-fins" across the entire substrate. The fins 22 include active fins 22A and sacrificial fins 22R that will eventually be removed (different shading has been used for each type of fin). Also depicted in dashed lines are illustrative gate structures 24 that will eventually be formed across the active fins 22A after the sacrificial fins 22R are removed. Given the regular arrangement of the fins 22 in the logic area 20, the fin removal process is relatively straightforward.

FIGS. 3A-3B are simplistic depictions of two different versions of SRAM devices wherein both active fins 22A and sacrificial fins 22R have been formed above the substrate as part of the formation of the initial "sea-of-fins." Also depicted are illustrative active regions 26, gate structures 24 (dashed lines) that will eventually be formed on the device, as well as an identification of the pull-up transistor (PU), the pull-down transistor (PD) and the pass gate transistor (PG) of the devices. FIG. 3A depicts a dense SRAM 30 wherein the pull-down transistor and the pass gate transistor only have a single active fin 22A. FIG. 3B depicts another SRAM 40 wherein the pull-down transistor and the pass gate transistor each have two active fins 22A. As noted above, the sacrificial fins 22R will need to be removed at some point in the process flow. One problem is that the spacing 23 is smaller than the pitch between adjacent fins in logic devices. With such tight pitches in the SRAM devices, the traditional fin removal processes mentioned above may tend to damage adjacent active fins in the SRAM devices.

The present disclosure is directed to various methods of forming FinFET devices in different regions of an integrated circuit product that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming FinFET devices in different regions of an integrated circuit product. In one example, the method includes, among other things, performing at least one process operation to form a first plurality of active fins and at least one sacrificial fin in a first area of a substrate while forming only a second plurality of active fins in a second area of said substrate, forming a fin removal masking layer that covers all of the active fins in both said first and second areas and exposes said at least one sacrificial fin in the first area, with the fin removal masking layer in position, performing at least one etching process to remove the at least one sacrificial fin in the first area and removing the fin removal masking layer.

In another embodiment, the method disclosed herein includes performing at least one process operation to form a first plurality of active fins and at least one sacrificial fin in a logic area of a substrate while forming only a second plurality of active fins in a memory area of the substrate, forming a fin removal masking layer that covers all of the active fins in both the logic area and the memory area and exposes the at least one sacrificial fin in the logic area, with the fin removal masking layer in position, performing at least one etching process to remove the at least one sacrificial fin in the logic area, and removing the fin removal masking layer.

A further illustrative method includes, among other things, forming a patterned logic mandrel layer only above a logic area of a semiconductor substrate, the patterned logic mandrel layer comprising a plurality of logic mandrel features, forming a patterned memory mandrel layer only above a memory area of the substrate, the patterned memory mandrel layer comprising a plurality of memory mandrel features, forming sidewall spacers adjacent the logic mandrel features and adjacent the memory mandrel features, removing the logic mandrel features and the memory mandrel features so as to define a patterned layer comprised of the sidewall spacers that defines a combined fin etch pattern for the logic area and the memory area, and performing at least one etching process to transfer the combined fin etch pattern to a fin formation hard mask layer positioned above both the logic area and the memory area of the substrate.

BRIEF DESCRIPTION OF THE DRAWINGS

The disclosure may be understood by reference to the following description taken in conjunction with the accompanying drawings, in which like reference numerals identify like elements, and in which.

Figure 1:
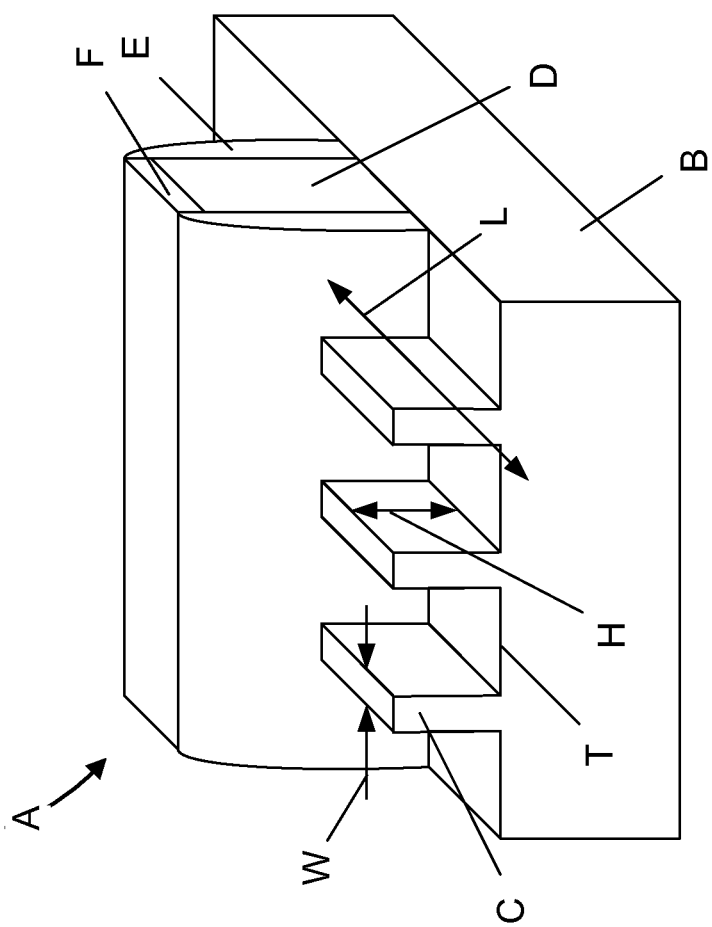
FIG. 1 is a perspective view of an illustrative prior art FinFET semiconductor device.
Figure 2:
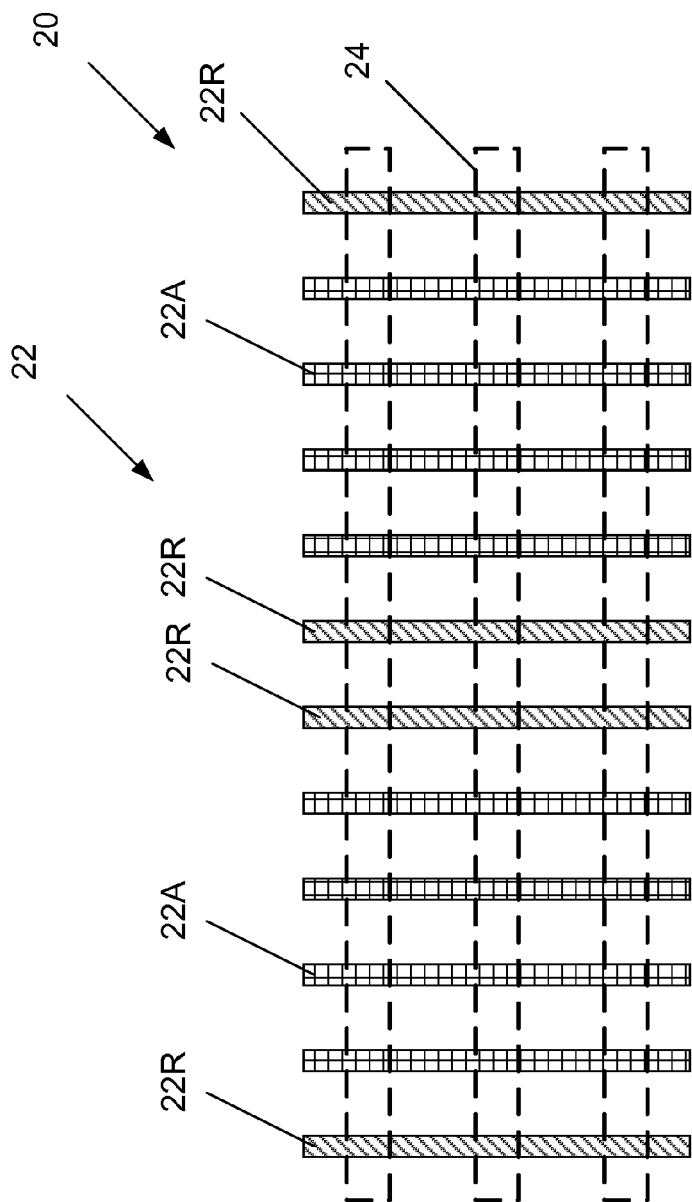
FIG. 2 is a simplistic depiction of an illustrative logic area of an integrated circuit product.
Figure 3A:
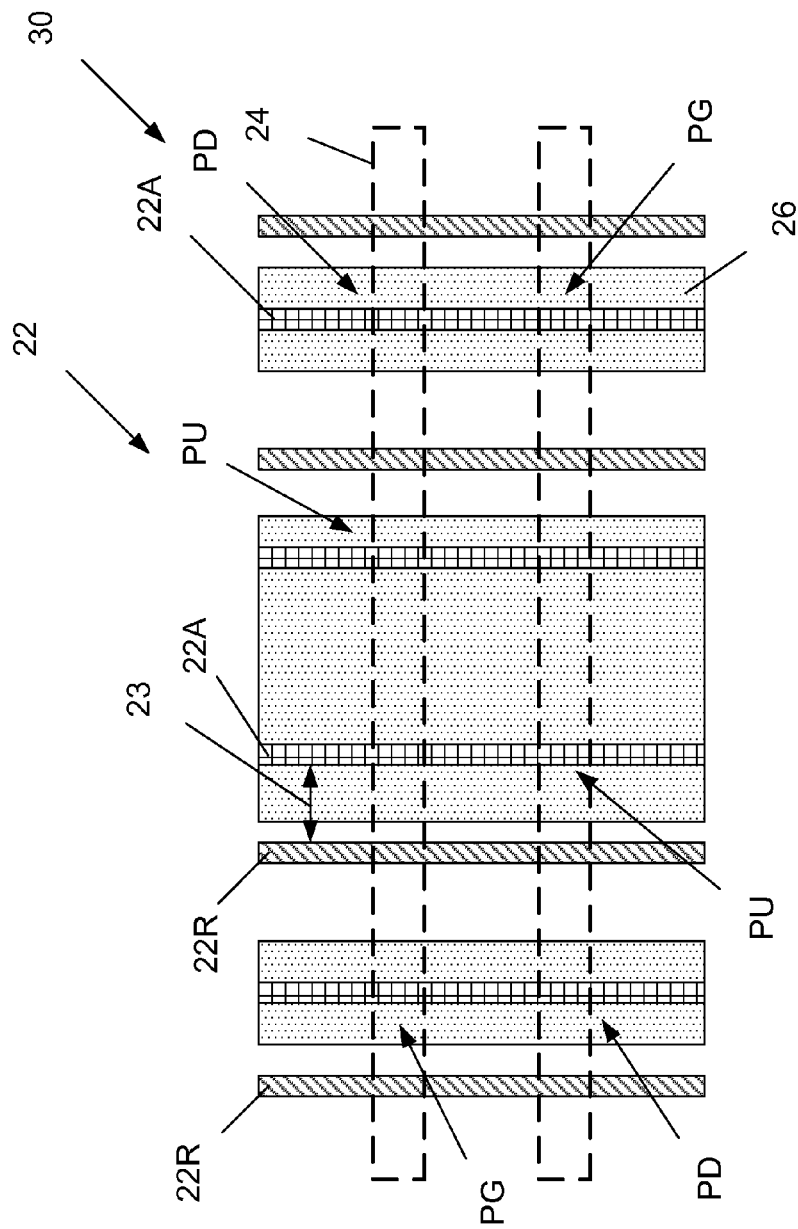
FIGS. 3A-3B are simplistic depictions of two different versions of prior art SRAM devices.
Figure 3B:
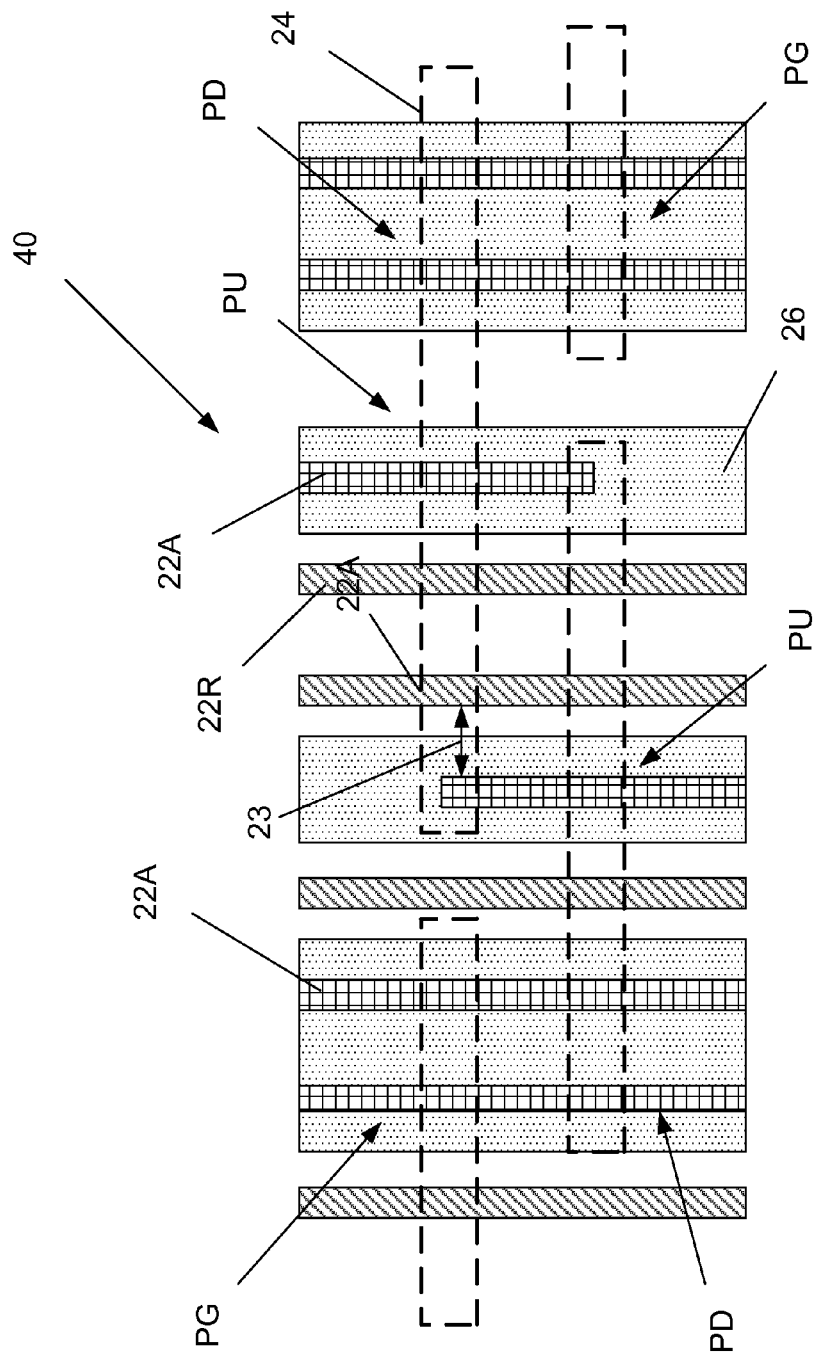

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to various methods of forming FinFET devices in different regions of an integrated circuit product such as for FinFET devices in both the memory and logic regions of an integrated circuit product that will be separated by isolation material or regions (not shown) when the product is completely fabricated. FIGS. 4A-4S depict one illustrative method disclosed herein for forming FinFET devices in both the memory and logic regions of an integrated circuit product 100 where the memory area includes illustrative SRAM memory devices. However, after a complete reading of the present application, those skilled in the art will readily appreciate that the subject matter disclosed herein may also be applied in the context of forming various types of different devices in different regions of the integrated circuit product. For example, the present invention may be performed where two different types of logic devices are formed in first and second regions of the substrate, where two different types of memory devices are formed in first and second regions of the substrate or where memory and logic devices are formed in two different regions of the substrate. Thus, the present invention should not be considered to be limited to the illustrative example disclosed herein where memory and logic devices are formed in the different regions. Additionally, memory devices other than SRAM memory devices, such as, dual-port bit cells, etc., may also be formed using the methods disclose herein as well as standard logic devices and non-standard logic devices (analog logic devices). Thus, the fact that the present subject matter is disclosed in the context of the formation of an illustrative SRAM memory device and standard logic devices should not be considered as a limitation of the inventions disclosed herein.

FIG. 4A depicts an illustrative integrated circuit product 100 at an early stage of manufacture. In general, the integrated circuit product 100 is formed above a semiconductor substrate 102. As is common, the substrate 102 is segregated into one or more areas or regions where different type devices are formed so as to increase manufacturing efficiency and product functionality. More specifically, in the depicted example, the substrate 102 is divided into different regions or areas, i.e., one or more logic areas or regions 102L and one or more memory areas or regions 102M1, 102M2. Thousands of logic devices, e.g., microprocessors, ASICs, etc., will be formed in the logic areas 102L, while thousands of memory devices, e.g., SRAM devices, will be formed in the memory areas 102M1, 102M2 of the substrate 102. In one illustrative embodiment, the semiconducting substrate 102 may be a silicon-on-insulator (SOI) substrate comprised of bulk silicon, a buried insulation layer (commonly referred to as a "BOX" layer) and an active layer (in and above which semiconductor devices are formed), which may also be a silicon material. Of course, the present invention may also be employed when the substrate 102 is made of semiconducting materials other than silicon and/or it may be in another form, such as a bulk silicon configuration. Thus, the terms substrate or semiconductor substrate should be understood to cover all forms of semiconductor structures.

At the stage of manufacture depicted in FIG. 4A, various illustrative layers of material 104, 106, 108 and 110 have been formed above the substrate 102. In the example depicted herein, FinFET devices will be formed in the logic areas and the memory areas of the substrate 102 using a sidewall image transfer process. Thus, in general, the layers of material depicted in FIG. 4A should be made of a material that may be selectively etched with respect to the immediately adjacent layers of material. The thickness of the layers of material shown in FIG. 4A may vary depending upon the application, and they may be formed by any desired technique, chemical vapor deposition (CVD), atomic layer deposition (ALD), epitaxial deposition, etc. As described more fully below, the layer 104 will become a patterned fin formation hard mask layer that will be used when fins for the various FinFET devices are formed in the substrate 102. However, as will be appreciated by those skilled in the art after a complete reading of the present application, one or more of the layers 104, 106 and 108 may be deleted by optimizing the etch selectivity among the various layers.

Figure 4B:
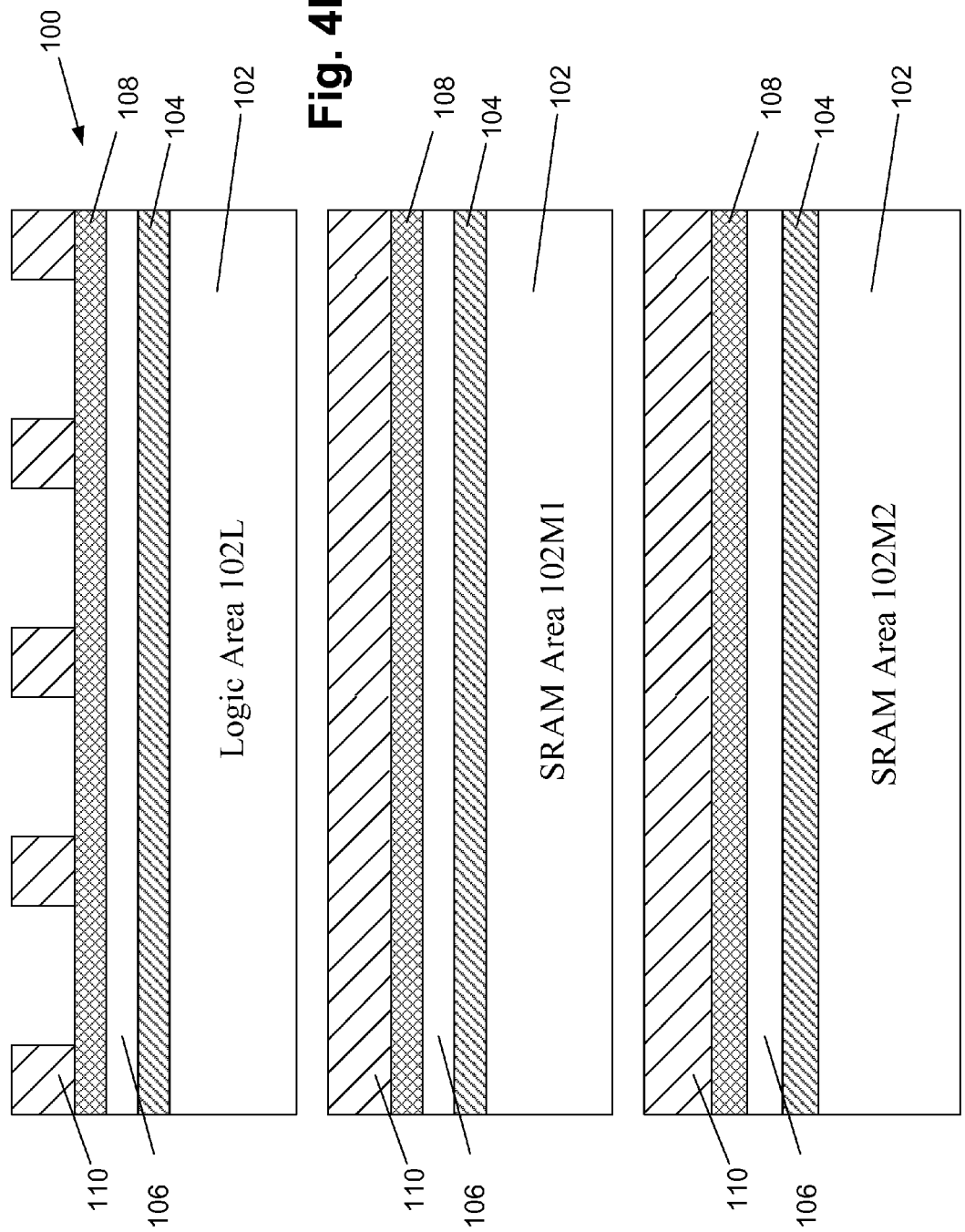
FIGS. 4A-4S depict various illustrative methods disclosed herein for forming FinFET devices in different regions of an integrated circuit product.

FIG. 4B depicts the product 100 after one or more etching processes were performed through a patterned etch mask (not shown), such as a patterned layer of photoresist material, to pattern the portion of the hard mask layer 110 positioned above the logic area 102L. Note that the hard mask layer 110 is not patterned above the memory areas 102M1, 102M2.

FIG. 4C depicts the product 100 after one or more etching processes were performed through the patterned hard mask layer 110 to pattern the portion of the underlying hard mask layer 108 positioned above the logic area 102L. Note that the hard mask layer 108 is not patterned above the memory areas 102M1, 102M2.

Figure 4D:
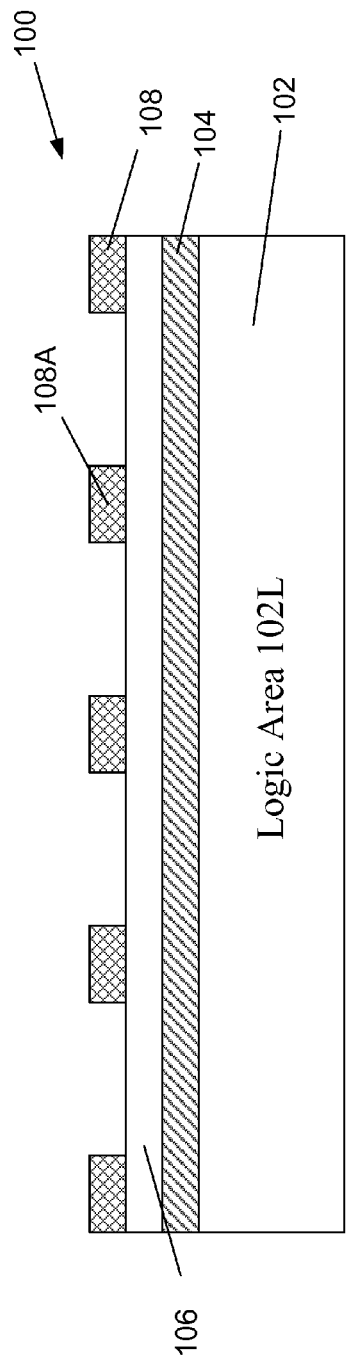
Figure 4D:
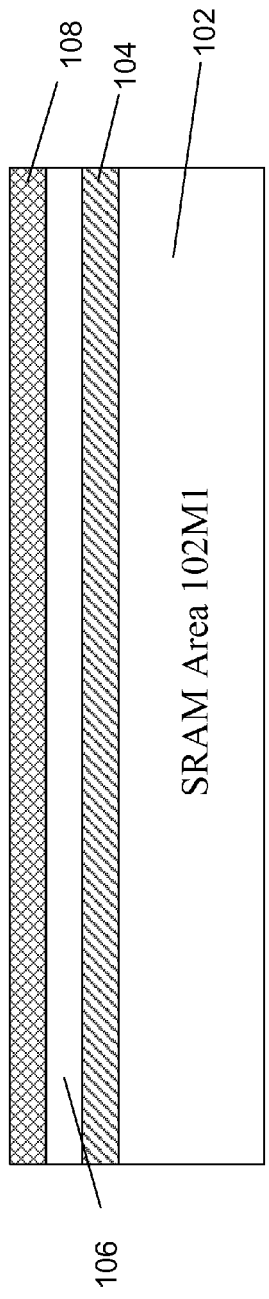
Figure 4D:
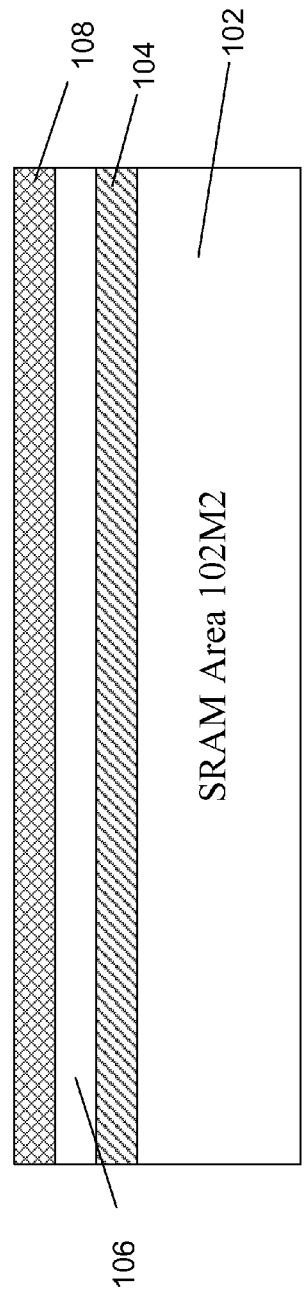

FIG. 4D depicts the product 100 after the patterned hard mask layer 110 was removed from the product 100.

FIG. 4E depicts the product 100 after a layer of material 112 was conformably deposited on the patterned hard mask layer 108. The layer of material 112 may be formed by any known process, e.g., ALD, CVD, it may be comprised of any material, and it may be formed to any desired thickness.

Figure 4F:
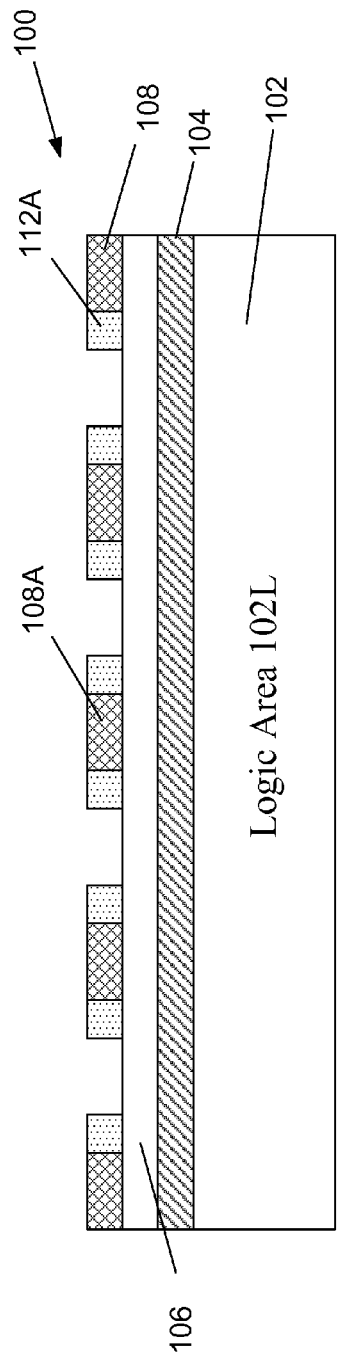
Figure 4F:
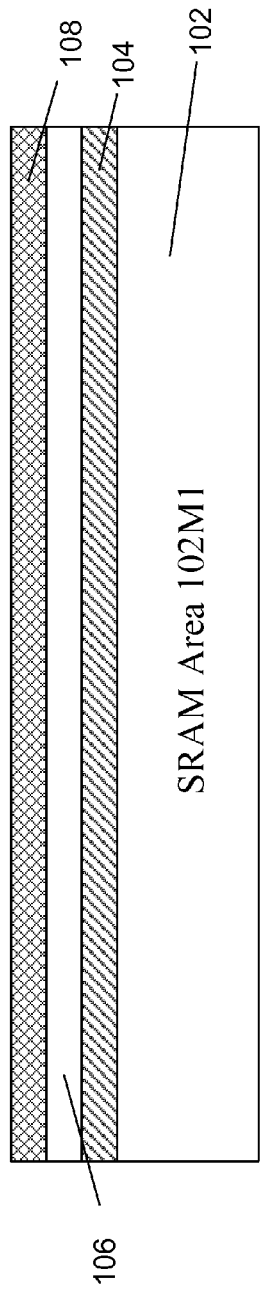
Figure 4F:
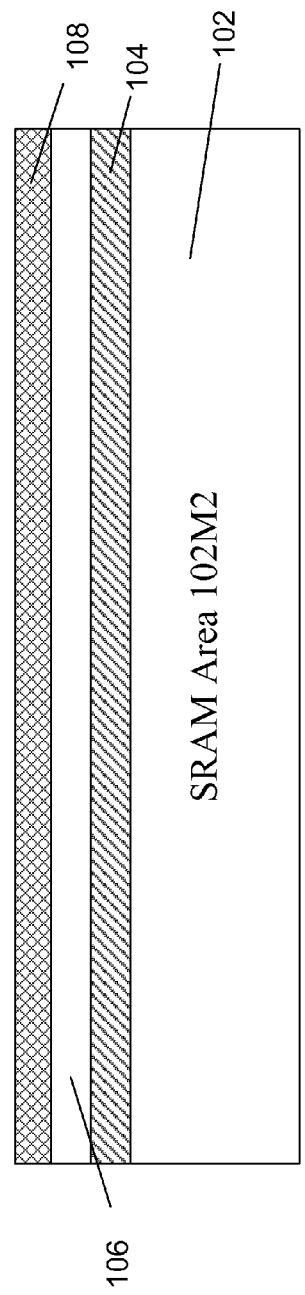

FIG. 4F depicts the product 100 after an anisotropic etching process was performed on the layer of material 112 so as to form sidewall spacers 112A that are positioned adjacent the features of the patterned hard mask layer 108.

Figure 4G:
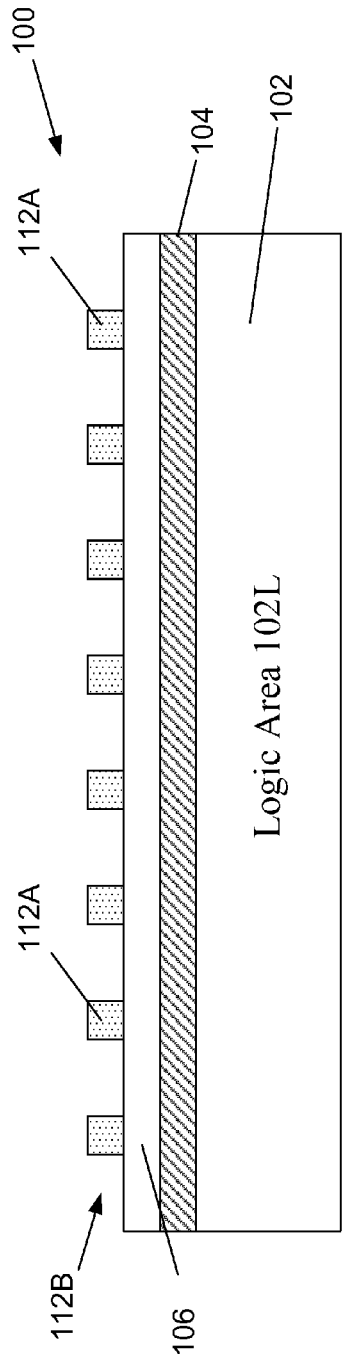
Figure 4G:
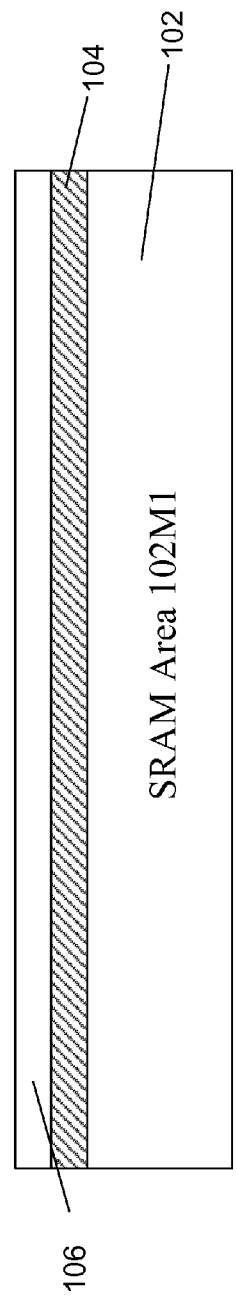
Figure 4G:
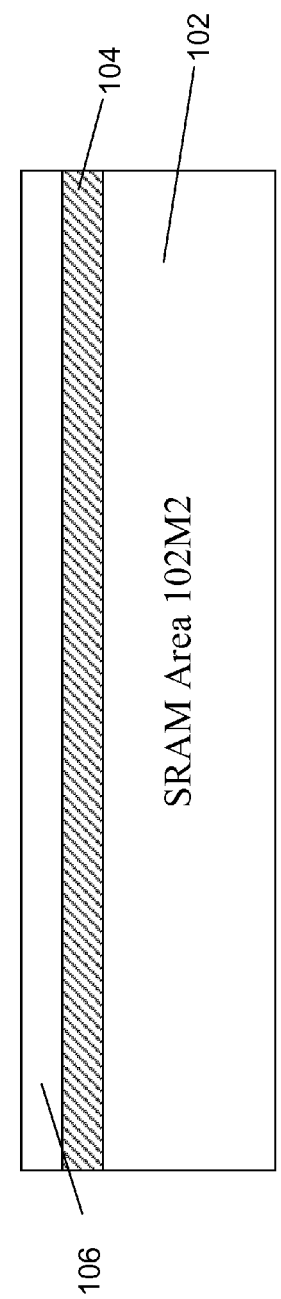

FIG. 4G depicts the product 100 after the patterned hard mask layer 108 was removed from the product 100. This leaves the sidewall spacers 112A positioned above only the logic area 102L of the substrate 102. The spacers 112A constitute a patterned logic mandrel layer 112B having a plurality of logic mandrel features 112A. Although not depicted in the illustrative process flow disclosed herein, as an alternative, at the point of processing depicted in FIG. 4G, an etching process may be performed through the patterned logic mandrel layer 112B on the hard mask layer 106 to transfer the pattern in the patterned logic mandrel layer 112B to the hard mask layer 106. This alternative would remove the hard mask material layer 106 from above the memory areas 102M1, 102M2.

Figure 4H:
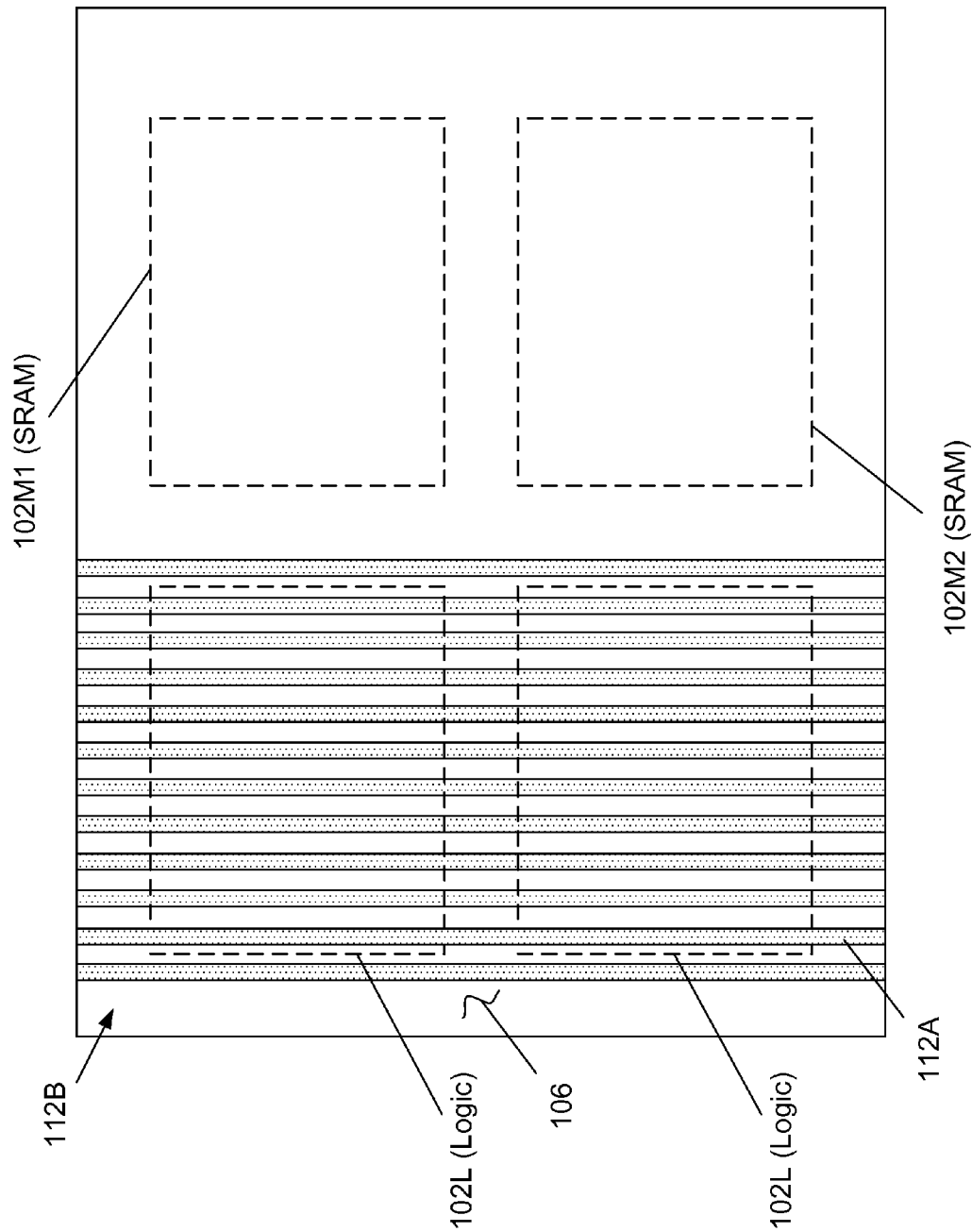

FIG. 4H is a simplistic plan view depicting the product 100 at the point of fabrication depicted in FIG. 4G. As noted above, the logic mandrel features 112A (i.e., the sidewall spacers 112A) are only positioned above the two illustrative logic regions 102L (shown in dashed lines) of the substrate 102. Note that there are no sidewalls spacers 112A positioned above the memory regions 102M1, 102M2 (also shown in dashed lines).

FIG. 4I depicts the product 100 after a hard mask material layer 118 was deposited above the product 100, i.e., above the logic region 102L and the memory regions 102M1, 102M2. Thus, the hard mask layer 118 should be made of a material that may be selectively etched with respect to the immediately adjacent layers of material. The thickness of the hard mask layer 118 may vary depending upon the application, and it may be formed by any desired technique, e.g., CVD, ALD, etc.

Figure 4J:
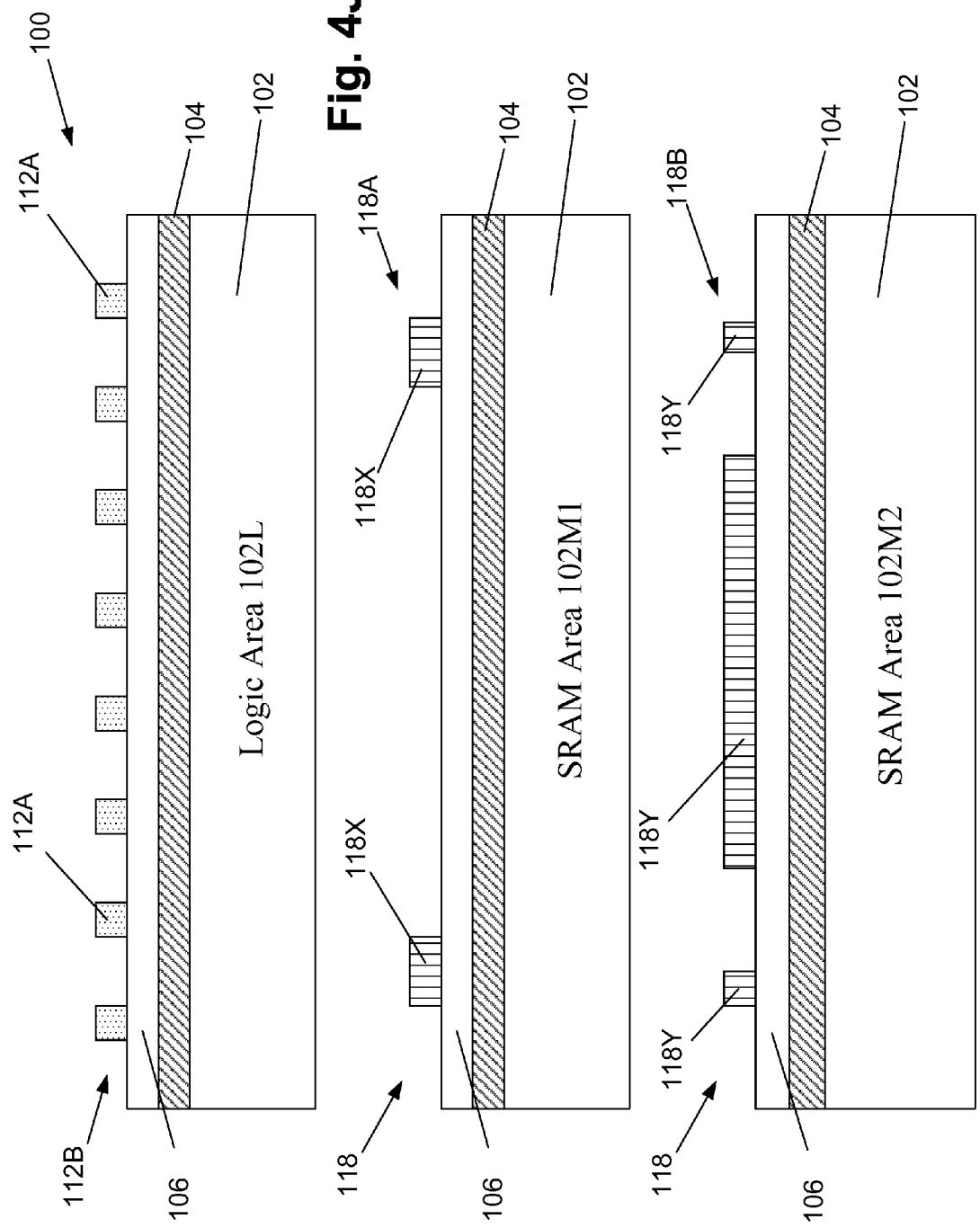

FIG. 4J depicts the product 100 after the hard mask layer 118 was patterned using a patterned photoresist mask (not shown) so as to define a patterned memory mandrel layer 118, having a plurality of memory mandrel features. A first portion 118A of the patterned memory mandrel layer 118 is positioned above the memory region 102M1, while a second portion 118B of the patterned memory mandrel layer 118 is positioned above the memory region 102M2. The first portion 118A is comprised of illustrative memory mandrel features 118X, while the second portion 118B is comprised of illustrative memory mandrel features 118Y. Note that the patterns reflected by the first portion 118A and the second portion 118B need not be the same (although they may be in some cases) so as to account for the situation where memory devices having different features or arrangement of features may be fabricated in the two different memory regions. Although not depicted in the illustrative process flow disclosed herein, as an alternative, at the point of processing depicted in FIG. 4J, an etching process may be performed on the hard mask layer 106 through both the patterned logic mandrel layer 112B and the patterned memory mandrel layer 118 to transfer the combined pattern reflected in the layers 112B, 118 to the hard mask layer 106. Thereafter, the spacers 120A (discussed below) may be formed adjacent the features in the patterned hard mask layer 106.

FIG. 4K depicts the product 100 after a layer of material 120 was conformably deposited on the patterned logic mandrel layer 112B (positioned above the logic region 102L) and on the patterned memory mandrel layer 118 (positioned above the memory regions 102M1, 102M2). The layer of material 120 may be formed by any known process, e.g., ALD, CVD, it may be comprised of any material, and it may be formed to any desired thickness.

Figure 4L:
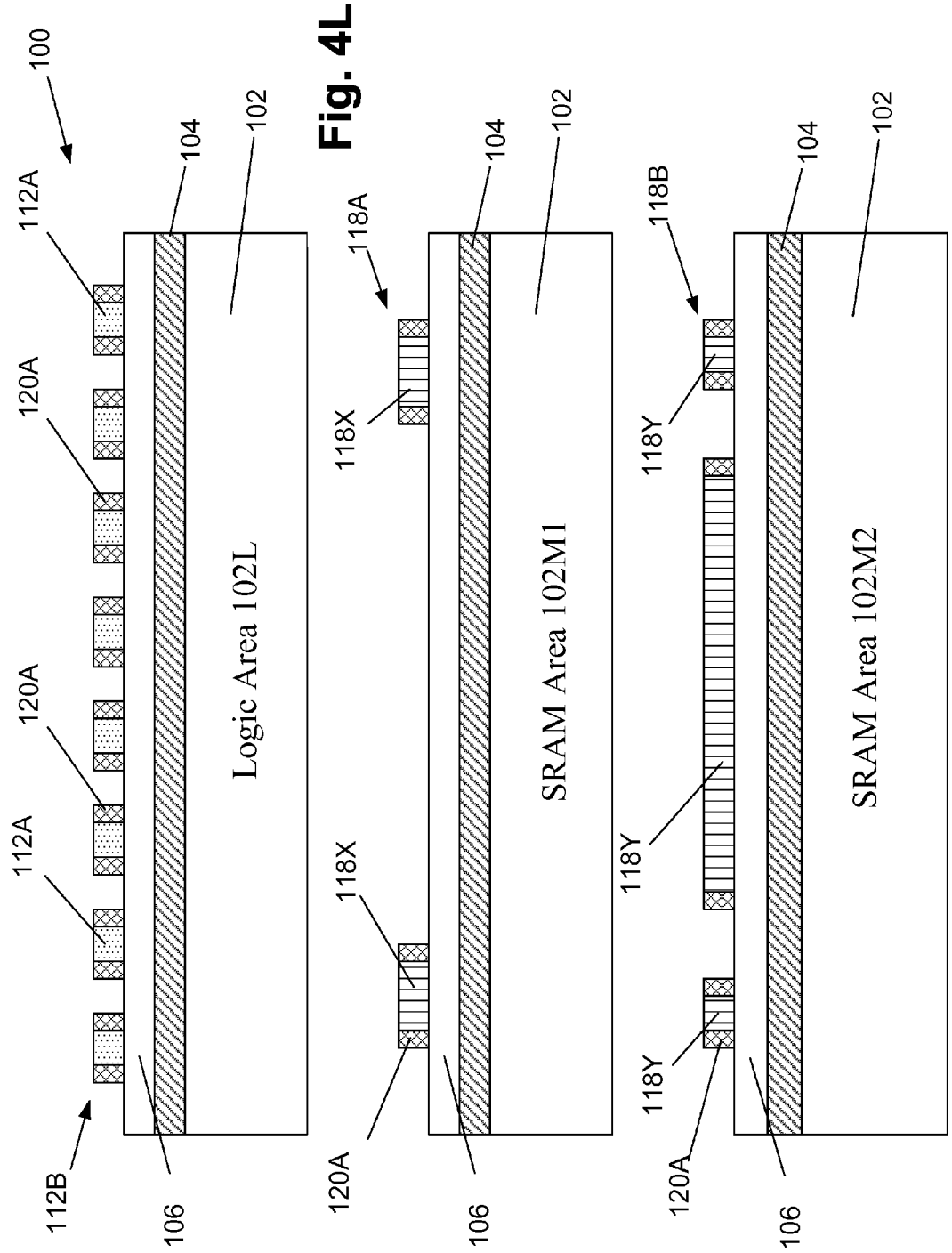

FIG. 4L depicts the product 100 after an anisotropic etching process was performed on the layer of material 120 so as to form sidewall spacers 120A adjacent the logic mandrel features 112A in the patterned logic mandrel layer 112B and adjacent the memory mandrel features 118X, 118Y of the patterned memory mandrel layer 118.

FIG. 4M depicts the product 100 after the patterned logic mandrel layer 112B and the patterned memory mandrel layer 118 were removed from the product 100. In some cases, depending upon the materials of construction, the patterned logic mandrel layer 112B and the patterned memory mandrel layer 118 may be removed by performing a common removal process operation (e.g., a common etching process) or they may be removed by performing separate removal process operations. Removal of the patterned logic mandrel layer 112B and the patterned memory mandrel layer 118 leaves the sidewall spacers 120A positioned above both the logic region 102L and the memory regions 102M1, 102M2. The layer of spacers 120A is a patterned layer 122 that defines a combined fin etch pattern for fins in the logic area 102L and fins in the memory areas 102M1, 102M2. Importantly, unlike prior art processing techniques, by separately forming the portions of the layer 122 (the combined fin etch pattern) above the logic and memory areas of the substrate 102, the traditional fin removal process that is typically performed in the memory region to remove sacrificial fins formed therein can be omitted. More specifically, by forming the patterned memory mandrel layer 118 selectively above just the memory regions, only active fins in memory regions 102M1, 102M2 need be formed, i.e., sacrificial fins need not be formed in the memory regions 102M1, 102M2. Accordingly, unlike prior art processing techniques, a potentially damaging fin removal process need not be performed in the memory regions where a very tight pitch may be present and where removal of sacrificial fins may cause damage to active fins in the memory regions.

At the point of fabrication depicted in FIG. 4M, the combined fin etch pattern reflected in the patterned layer 122 is sequentially transferred to underlying layers of material and ultimately into the substrate 102. Accordingly, FIG. 4N depicts the product 100 after the combined fin etch pattern was transferred to the hard mask layer 106 by performing one or more etching processes through the patterned layer 122, and after the patterned layer 122 was removed.

FIG. 4O depicts the product 100 after the combined fin etch pattern was transferred to the patterned fin formation hard mask layer 104 by performing one or more etching processes through the patterned hard mask layer 106, and after the patterned hard mask layer 106 was removed. Of course, the patterned fin formation hard mask layer 104 may be comprised of a single layer of material or multiple layers of material, e.g., a pad oxide positioned under a pad nitride layer, etc.

Figure 4P:
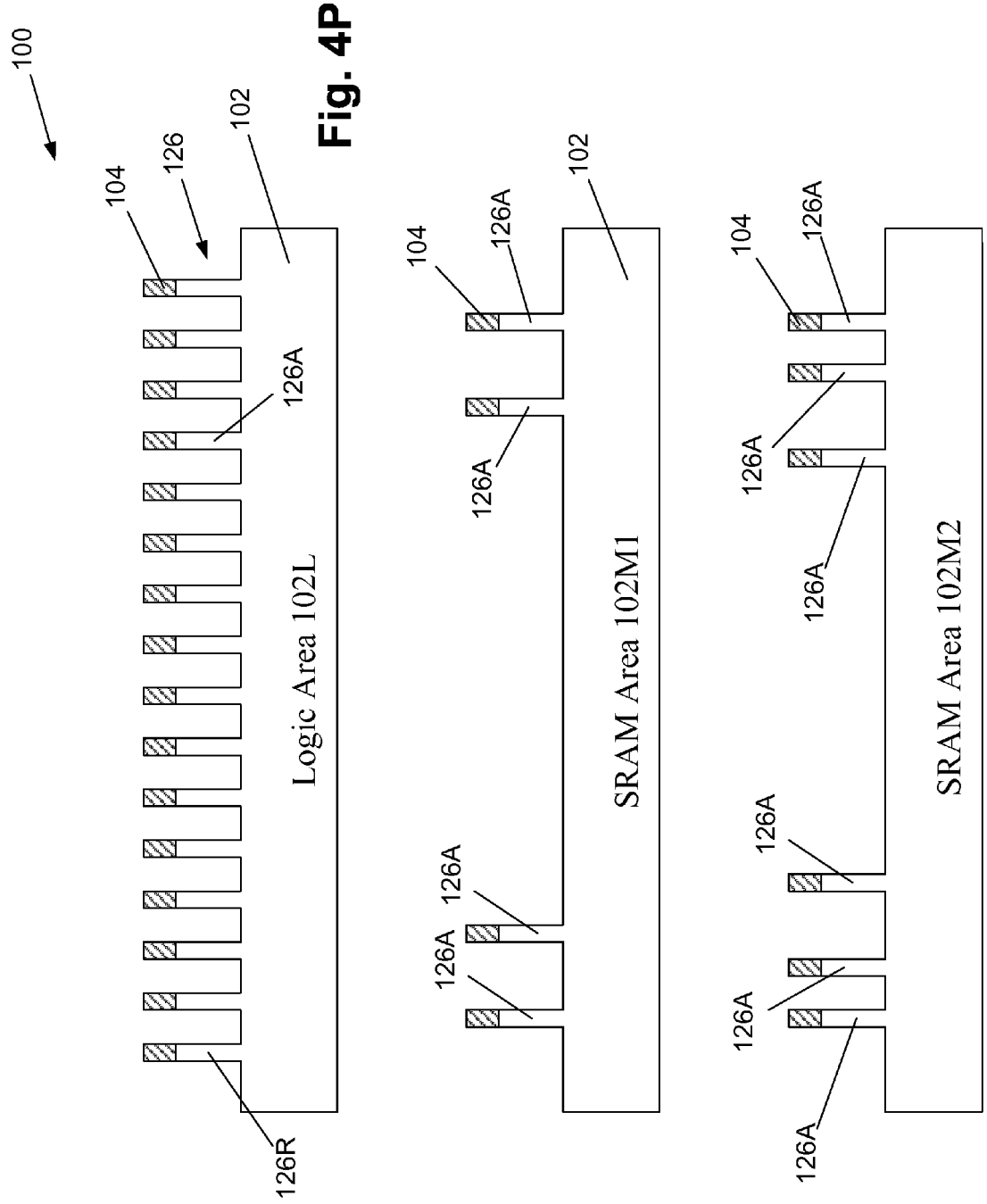

FIG. 4P depicts the product 100 after one or more etching processes were performed through the patterned fin formation hard mask layer 104 to form a plurality of fins, generally designated with the reference number 126, in the logic region 102L and the memory regions 102M1, 102M2. However, using the methods disclosed herein, only active fins 126A are formed in the memory regions, while both active fins 126A and sacrificial fins 126R are formed in the logic area of the substrate 102. The fins 126 may be of any desired shape or configuration and they may be formed to any desired height.

Figure 4Q:
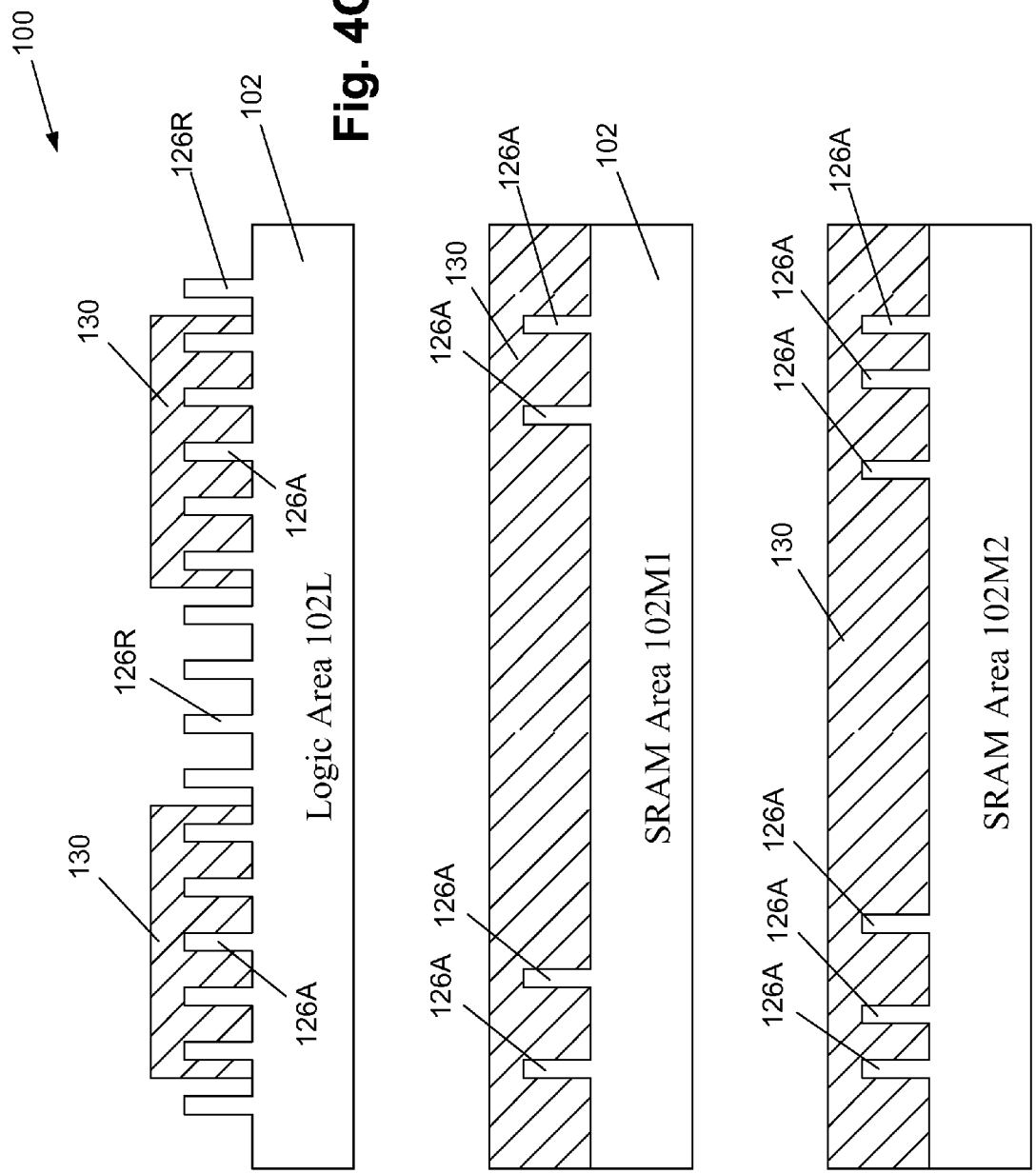

FIG. 4Q depicts the product 100 after several process operations were performed. First, the patterned fin formation hard mask layer 104 was removed from the product 100. Next, a patterned fin removal masking layer 130 was formed above the substrate 102. The patterned fin removal masking layer 130 covers both of the memory regions 102M1, 102M2, but exposes some of the fins in the logic area 102L so that they may be removed. More specifically, the patterned fin removal masking layer 130 covers the active fins 126A in the logic area 102L and in both of the memory areas, but exposes the sacrificial fins 126R in the logic region 102L so that they may be removed. In one embodiment, the patterned fin removal masking layer 130 may be a patterned layer of photoresist material that is formed using traditional photolithography tools and techniques.

Figure 4R:
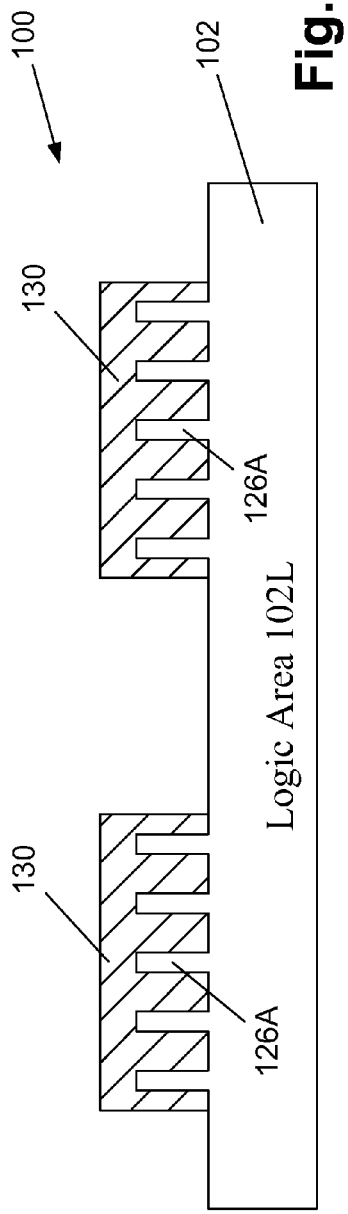
Figure 4R:
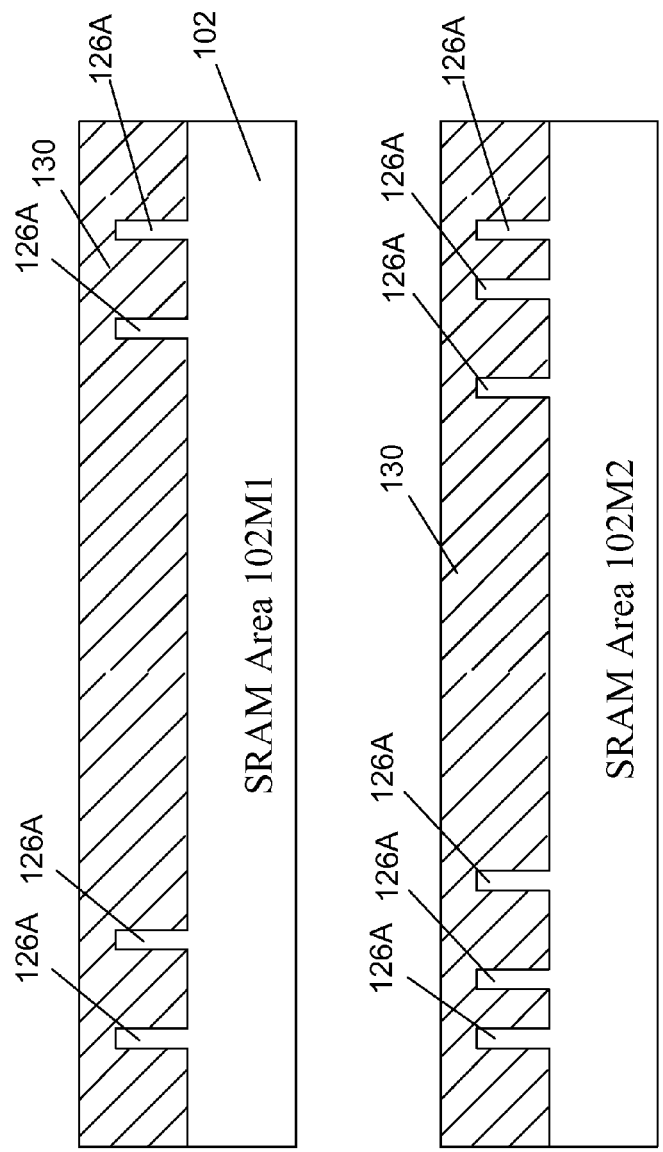

FIG. 4R depicts the product 100 after one or more etching processes were performed through the patterned fin removal masking layer 130 to remove the exposed sacrificial fins 126R in the logic area 102L.

FIG. 4S depicts the product 100 after the patterned fin removal masking layer 130 was removed. At this point in the process flow, traditional processing operations may be performed to complete the formation of the product 100. For example, the remaining fins may be cut to their desired axial length, isolation material may be formed in the spaces between the fins, gate structures may be formed around the fins, etc. Of course, at some point in the process flow, the remaining active fins 126A may be cut to their desired axial length (in the current transport direction of the fins) by forming a separate fin cut mask (not shown) and performing one or more etching processes. Additionally, although an illustrative SAOP (Self Aligned Octuplet Patterning) has not been depicted herein, those skilled in the art with benefit of the present application will appreciate that the methods disclosed herein may be used in a patterning method that involves any number of mandrel layers. Thus the patterned logic mandrel layer and the patterned memory mandrel layer referenced in this application and in the claims should be understood to be any such patterned mandrel layers formed at any point in any sidewall imagining transfer patterning process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   performing at least one process operation to form a first plurality of active fins and at least one sacrificial fin in a logic area of a substrate while forming only a second plurality of active fins in a memory area of said substrate;
   forming a fin removal masking layer that covers all of the active fins in both said logic area and said memory area and exposes said at least one sacrificial fin in said logic area;
   with said fin removal masking layer in position, performing at least one etching process to remove said at least one sacrificial fin in said logic area; and
   removing said fin removal masking layer.

2. The method of claim 1, wherein said first plurality of active fins in said logic area are active fins for a FinFET device used in a microprocessor, and wherein said second plurality of active fins in said memory area are active fins for a FinFET device used in a memory device.

3. The method of claim 1, wherein performing said at least one process operation comprises forming a patterned layer comprised of a plurality of features that defines a combined fin etch pattern for said logic area and said memory area by:
   forming a logic mandrel layer above only said logic area;
   forming a memory mandrel layer above only said memory area;
   forming sidewall spacers adjacent features of said logic mandrel layer and adjacent features of said memory mandrel layer; and
   removing said logic mandrel layer and said memory mandrel layer so as to define the patterned layer comprised of said sidewall spacers that defines the combined fin etch pattern.

4. The method of claim 3, further comprising performing at least one etching process to transfer said combined fin etch pattern to a fin-formation hard mask layer positioned above said substrate.

5. The method of claim 4, further comprising performing at least one etching process through said fin-formation hard mask layer to define said first plurality of active fins, said second plurality of active fins and said at least one sacrificial fin.

6. A method, comprising:
   forming a patterned logic mandrel layer only above a logic area of a semiconductor substrate, said patterned logic mandrel layer comprising a plurality of logic mandrel features;

forming a patterned memory mandrel layer only above a memory area of said substrate, said patterned memory mandrel layer comprising a plurality of memory mandrel features;

forming sidewall spacers adjacent said logic mandrel features and adjacent said memory mandrel features;

removing said logic mandrel features and said memory mandrel features so as to define a patterned layer comprised of said sidewall spacers that defines a combined fin etch pattern for said logic area and said memory area; and performing at least one etching process to transfer said combined fin etch pattern to a fin-formation hard mask layer positioned above both said logic area and said memory area of said substrate.

7. The method of claim 6, further comprising performing at least one etching process through the patterned fin-formation hard mask layer to define a first plurality of active fins and at least one sacrificial fin in said logic area while forming only a second plurality of active fins in said memory area.

8. The method of claim 7, further comprising removing said patterned fin-formation hard mask layer.

9. The method of claim 8, further comprising forming a fin removal masking layer that covers all of the active fins in both said logic area and said memory area and exposes said at least one sacrificial fin in said logic area.

10. The method of claim 9, further comprising, with said fin removal masking layer in position, performing at least one etching process to remove said at least one sacrificial fin in said logic area.

11. The method of claim 10, further comprising removing said fin removal masking layer.

12. A method, comprising:
performing at least one process operation to form a first plurality of active fins and at least one sacrificial fin in a logic area of a substrate while forming only a second plurality of active fins in a memory area of said substrate and while not forming any sacrificial fins in said memory area;

forming a fin removal masking layer that covers all of the active fins in both said logic area and the entire memory area and exposes said at least one sacrificial fin in said logic area;

with said fin removal masking layer in position, performing at least one etching process to remove said at least one sacrificial fin in said logic area; and removing said fin removal masking layer.

13. The method of claim 12, wherein performing said at least one process operation comprises forming a patterned layer comprised of a plurality of features that defines a combined fin etch pattern for said logic area and said memory area by:
forming a logic mandrel layer above only said logic area;
forming a memory mandrel layer above only said memory area;
forming sidewall spacers adjacent features of said logic mandrel layer and adjacent features of said memory mandrel layer; and
removing said logic mandrel layer and said memory mandrel layer so as to define said patterned layer comprised of said sidewall spacers that defines said combined fin etch pattern.

14. The method of claim 12, further comprising performing at least one etching process to transfer said combined fin etch pattern to a fin-formation hard mask layer positioned above said substrate.

15. The method of claim 14, further comprising performing at least one etching process through said fin-formation hard mask layer to define said first plurality of active fins, said second plurality of active fins and said at least one sacrificial fin.

16. A method, comprising:
performing at least one process operation to form a first plurality of active fins and at least one sacrificial fin in a first area of a substrate while forming only a second plurality of active fins in a second area of said substrate;

forming a fin removal masking layer that covers all of the active fins in both said first and second areas and exposes said at least one sacrificial fin in said first area;

with said fin removal masking layer in position, performing at least one etching process to remove said at least one sacrificial fin in said first area; and removing said fin removal masking layer.

17. The method of claim 16, wherein said first plurality of active fins in said first area are active fins for a FinFET device used in a logic device, and wherein said second plurality of active fins in said second area are active fins for a FinFET device used in a memory device.

18. The method of claim 16, wherein said first plurality of active fins in said first area are active fins for a FinFET device used in a first type of logic device, and wherein said second plurality of active fins in said second area are active fins for a FinFET device used in a second type of logic device that has a different configuration from that of the first logic device.

19. The method of claim 18 wherein the first type of logic device is a standard logic device and the second type of logic device is an analog logic device.

20. The method of claim 16, wherein said first plurality of active fins in said first area are active fins for a FinFET device used in a first type of memory device, and wherein said second plurality of active fins in said second area are active fins for a FinFET device used in a second type of memory device that has a different configuration from that of the first memory device.

21. The method of claim 20, wherein the first type of memory device is a SRAM logic device and the second type of memory device is a dual port cell.

22. The method of claim 16, wherein performing said at least one process operation comprises forming a patterned layer comprised of a plurality of features that defines a combined fin etch pattern for said first area and said second area by:
forming a first mandrel layer above only said first area;
forming a second mandrel layer above only said second area;
forming sidewall spacers adjacent features of said first mandrel layer and adjacent features of said second mandrel layer; and
removing said first mandrel layer and said second mandrel layer so as to define the patterned layer comprised of said sidewall spacers that defines the combined fin etch pattern.

23. The method of claim 22, further comprising performing at least one etching process to transfer said combined fin etch pattern to a fin-formation hard mask layer positioned above said substrate.

24. The method of claim 23, further comprising performing at least one etching process through said fin-formation hard mask layer to define said first plurality of active fins, said second plurality of active fins and said at least one sacrificial fin.

* * * * *

UNITED STATES PATENT AND TRADEMARK OFFICE
CERTIFICATE OF CORRECTION

PATENT NO.         : 9,184,169 B2                                       Page 1 of 1
APPLICATION NO.    : 14/250064
DATED              : November 10, 2015
INVENTOR(S)        : Kim et al.

It is certified that error appears in the above-identified patent and that said Letters Patent is hereby corrected as shown below:

On the title page, item (71),
        Delete "GLOBALFOUNDIES Inc." and insert therefor
-- GLOBALFOUNDRIES Inc. --

Signed and Sealed this
First Day of March, 2016

Michelle K. Lee
*Director of the United States Patent and Trademark Office*